(12) United States Patent
Chen et al.

(10) Patent No.: US 11,751,401 B2
(45) Date of Patent: Sep. 5, 2023

(54) INTEGRATED CIRCUIT AND METHOD FOR MANUFACTURING THE SAME

(71) Applicant: TAIWAN SEMICONDUCTOR MANUFACTURING COMPANY, LTD., Hsinchu (TW)

(72) Inventors: Tzu-Yu Chen, Hsinchu (TW); Sheng-Hung Shih, Hsinchu (TW); Kuo-Chi Tu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 19 days.

(21) Appl. No.: 17/332,607

(22) Filed: May 27, 2021

(65) Prior Publication Data
US 2022/0384458 A1 Dec. 1, 2022

(51) Int. Cl.
| | | |
|---|---|---|
| H01L 29/51 | (2006.01) | |
| H01L 29/66 | (2006.01) | |
| H01L 21/28 | (2006.01) | |
| H01L 29/78 | (2006.01) | |
| H10B 51/30 | (2023.01) | |
| H10B 51/40 | (2023.01) | |

(52) U.S. Cl.
CPC ........ *H10B 51/30* (2023.02); *H01L 29/40111* (2019.08); *H01L 29/516* (2013.01); *H01L 29/6684* (2013.01); *H01L 29/78391* (2014.09); *H10B 51/40* (2023.02)

(58) Field of Classification Search
CPC .......... G11C 16/0408; H01L 21/02148; H01L 21/02181; H01L 21/0228; H01L 21/28088; H01L 29/40111; H01L 29/40114; H01L 29/4966; H01L 29/516; H01L 29/517; H01L 29/66545; H01L 29/66795; H01L 29/66825; H01L 29/6684; H01L 29/78391; H01L 29/7851; H01L 29/7883; H01L 21/823814; H01L 21/823821; H01L 21/823842; H01L 21/845; H01L 27/088; H01L 27/092; H01L 27/0924; H01L 27/1211; H01L 29/513

See application file for complete search history.

(56) References Cited

U.S. PATENT DOCUMENTS

| | | | | |
|---|---|---|---|---|
| 8,053,323 | B1 * | 11/2011 | Lin | ...................... H01L 29/7833 438/303 |
| 8,883,624 | B1 * | 11/2014 | Ramkumar | ........... H01L 29/513 438/257 |
| 2016/0155748 | A1 * | 6/2016 | Li | ....................... H01L 29/7883 257/295 |
| 2016/0225867 | A1 * | 8/2016 | Kim | .................... H01L 27/1211 |

\* cited by examiner

*Primary Examiner* — Meiya Li
(74) *Attorney, Agent, or Firm* — Birch, Stewart, Kolasch & Birch, LLP

(57) ABSTRACT

A semiconductor device includes a semiconductor substrate, a memory gate, and a data storage element. The semiconductor substrate includes a memory well which has two source/drain regions and a channel region between the source/drain regions. The memory gate is disposed above the channel region. The data storage element includes a ferroelectric material, and is disposed around the memory gate to separate the memory gate from the channel region.

20 Claims, 31 Drawing Sheets

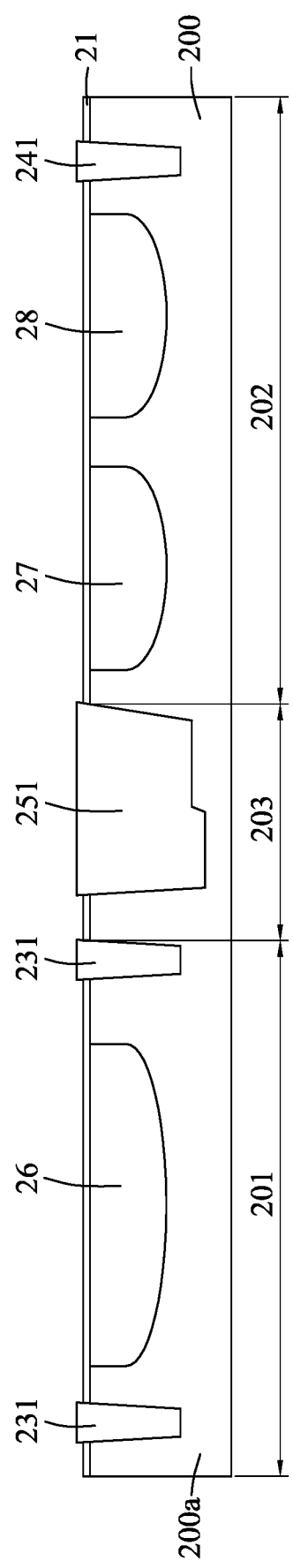
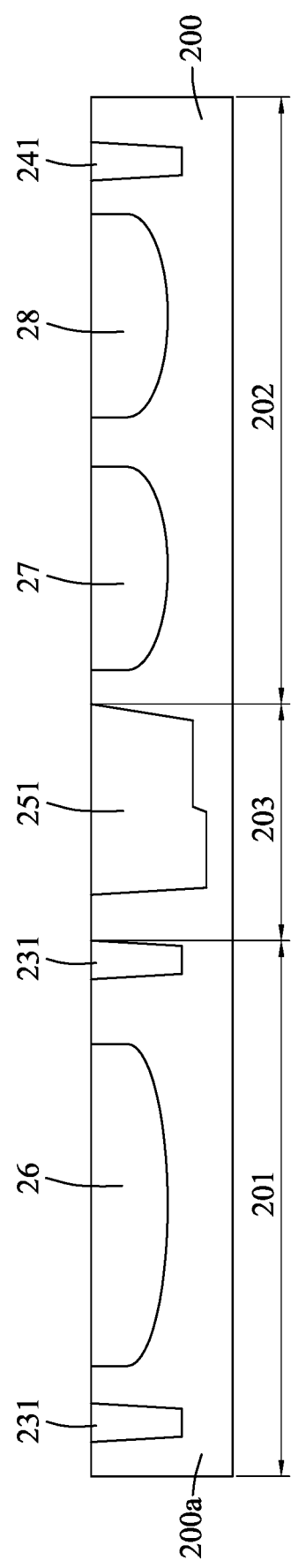
FIG. 7
FIG. 8

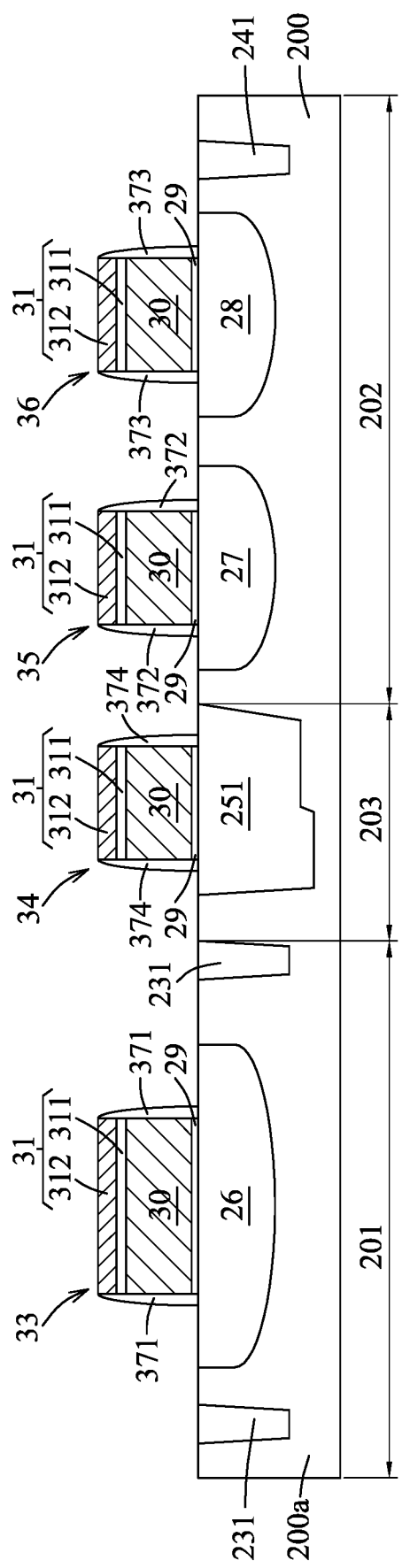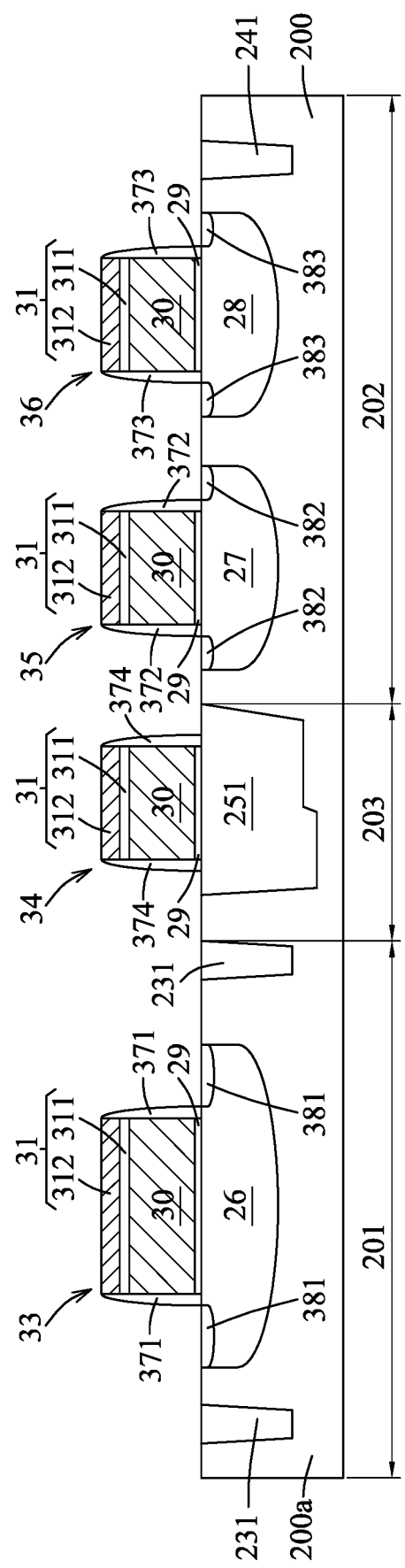

INTEGRATED CIRCUIT AND METHOD FOR MANUFACTURING THE SAME

BACKGROUND

An integrated circuit (IC) is an electronic device which may include many functional elements, such as transistors, capacitors, resistors, and/or ferroelectric dynamic random access memories (FeDRAMs). There is a continuous need to further simplify and improve a process for manufacturing the ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 to 40 are schematic views illustrating intermediate stages of the manufacturing method in accordance with some embodiments as depicted in FIGS. 1A to 1D.

DETAILED DESCRIPTION

Figure 1A:
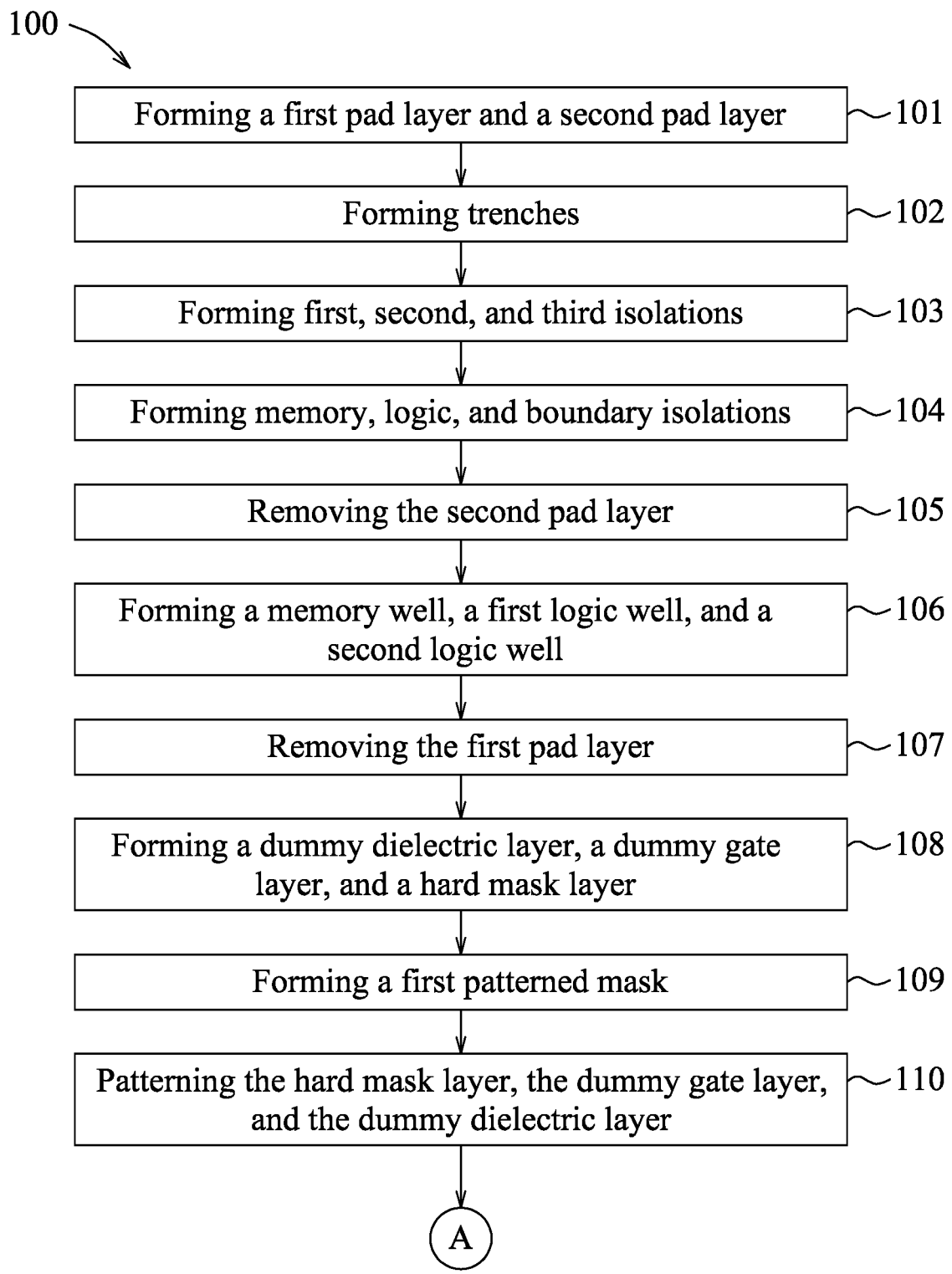
FIGS. 1A to 1D are flow diagrams illustrating a method for manufacturing an integrated circuit in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "upper," "lower," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to an integrated circuit (IC), and methods for manufacturing the same. The IC may include ferroelectric dynamic random access memory (FeDRAM) devices, logic devices, and a boundary isolation structure between the FeDRAM devices and the logic devices. According to some methods for manufacturing the IC, after a ferroelectric layer of each FeDRAM device and a logic high-k (HK) dielectric of each logic device are formed, a memory active gate of each FeDRAM device is formed on the ferroelectric layer using a replacement gate (RPG) process, and a logic active gate of each logic device is formed on the logic HK dielectric using another RPG process. Such methods may be referred to as HK first methods.

A challenge with the HK first methods is that the ferroelectric layer and/or the logic HK dielectric may be damaged by an etchant, such as hydrofluoric acid (HF) or other chemicals. In addition, when patterning the logic multiple films, a logic HK dielectric layer which is used for forming the logic HK dielectric may not be fully removed from a slanted sidewall of the boundary isolation structure.

FIGS. 1A to 1D are flow diagrams illustrating a method 100 for manufacturing an IC in accordance with some embodiments. The method 100 may be called as a HK last method. FIGS. 2 to 40 illustrate schematic views of the intermediate stages of the method 100.

Figure 2:
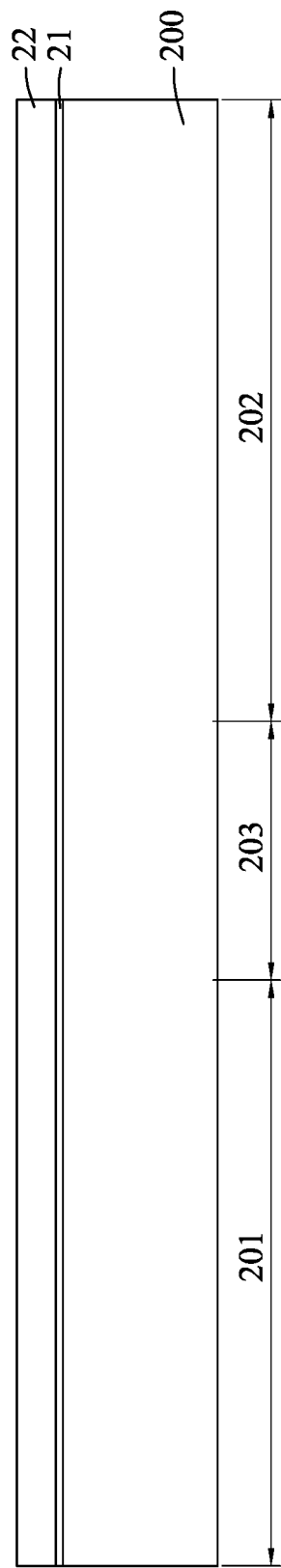

Referring to FIGS. 1A and 2, the method 100 begins at step 101, where a first pad layer 21 and a second pad layer 22 are sequentially formed on a semiconductor substrate 200. The semiconductor substrate 200 includes a memory substrate region 201, a logic substrate region 202, and a boundary substrate region 203 between the memory substrate region 201 and the logic substrate region 202. In some embodiments, the semiconductor substrate 200 may be or may include a bulk silicon substrate, a silicon-on-insulator substrate (SOI), or other suitable semiconductor materials. The first pad layer 21 and the second pad layer 22 may be made from different dielectric materials. For example, the first pad layer 21 may include silicon oxide, and the second pad layer 22 may include silicon nitride. Other suitable dielectric materials for the first pad layer 21 and the second pad layer 22 are within the contemplated scope of the present disclosure. Each of the first pad layer 21 and the second pad layer 22 may be deposited by, for example, but not limited to, chemical vapor deposition (CVD), physical vapor deposition (PVD), atomic layer deposition (ALD), thermal oxidation, or other suitable techniques.

Figure 3:
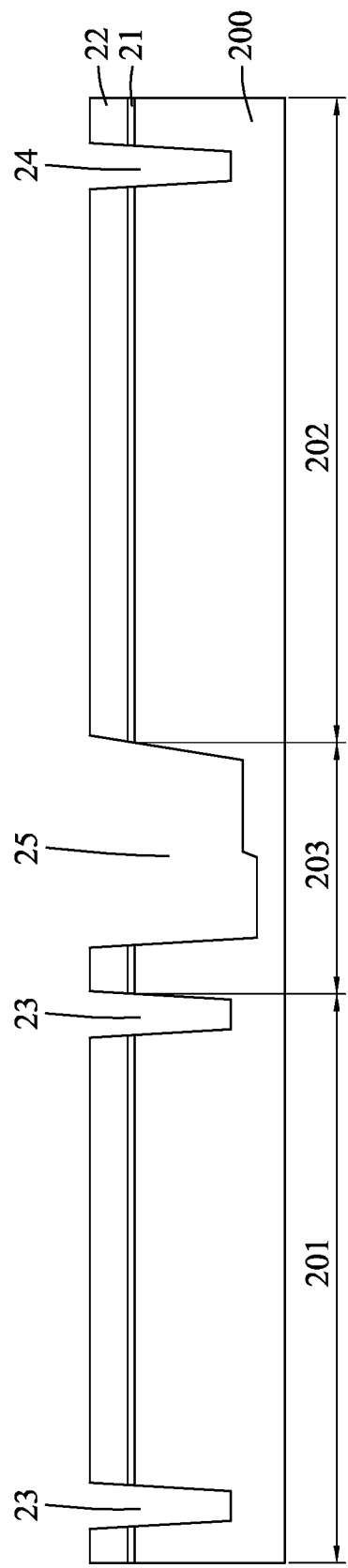

Referring to FIGS. 1A and 3, the method 100 proceeds to step 102, where a patterning process is conducted to form trenches 23, 24, 25 respectively in the memory substrate region 201, the logic substrate region 202, and the boundary substrate region 203. Step 102 may include (i) forming a patterned mask (not shown) on the second pad layer 22 to partially expose the second pad layer 22, (ii) etching the second pad layer 22, the first pad layer 21, and the semiconductor substrate 200 through the patterned mask to form the trenches 23, 24, 25, and (iii) removing the patterned mask. The etching may be implemented using dry etching, wet etching, or a combination thereof. The patterned mask may include a photoresist material or other suitable mask material, and may be formed by coating a photoresist layer, soft-baking, exposing the photoresist layer through a photomask, post-exposure baking, and developing the photoresist layer, followed by hard-baking to thereby form the patterned mask.

Figure 4:
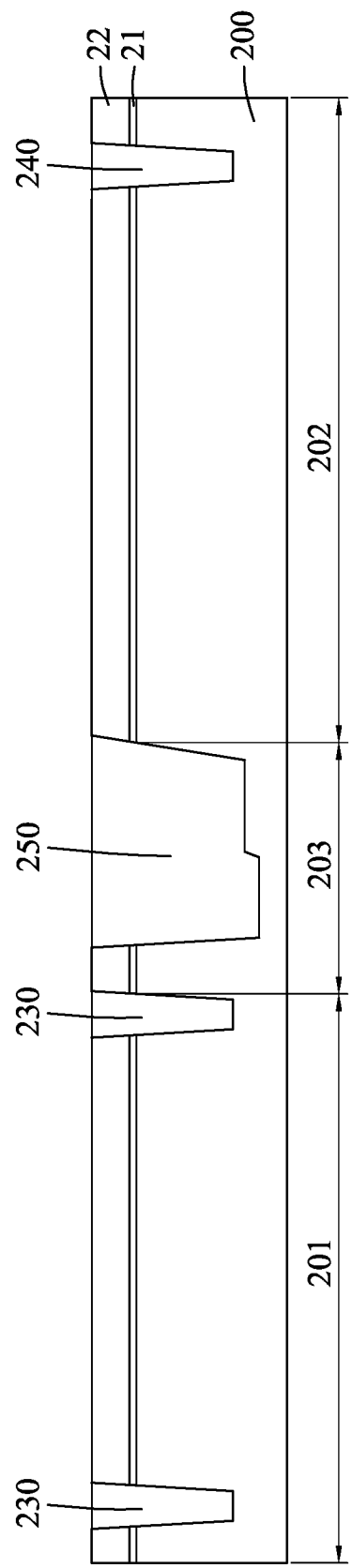

Referring to FIGS. 1A and 4, the method 100 proceeds to step 103, where first isolations 230, a second isolation 240, and a third isolation 250 are respectively formed in the trenches 23, 24, 25 shown in FIG. 3. Step 103 may include (i) depositing a dielectric layer (not shown) over the structure of FIG. 3 to fill the trenches 23, 24, 25, and (ii)

conducting a planarization process, such as a chemical mechanical polishing (CMP) process or other suitable techniques, to remove the dielectric layer on the second pad layer 22 so as to obtain the first, second, and third isolations 230, 240, 250. Each of the first, second, and third isolations 230, 240, 250 may include, for example, silicon oxide. Other suitable materials for the first, second, and third isolations 230, 240, 250 are within the contemplated scope of the present disclosure.

Figure 5:
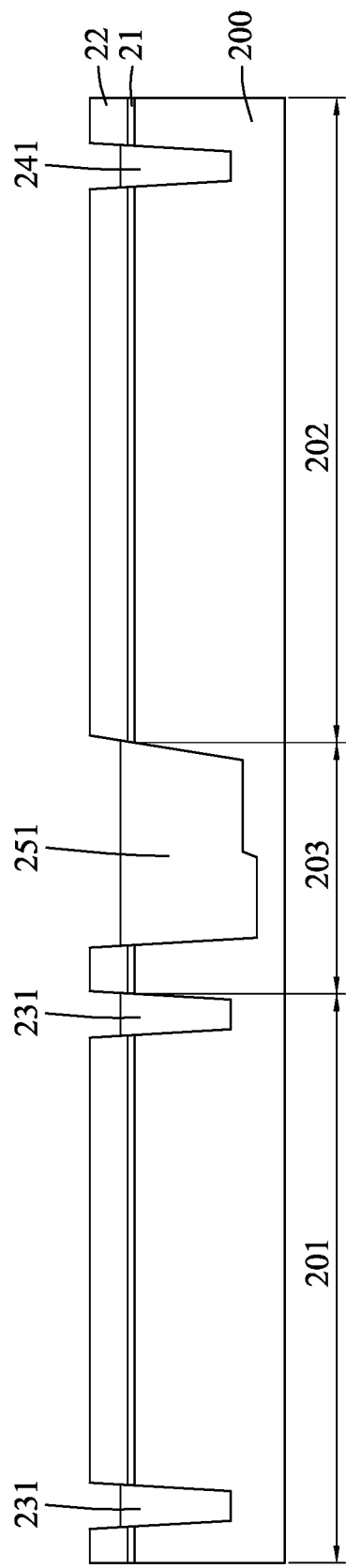

Referring to FIGS. 1A and 5, the method 100 proceeds to step 104, where the first, second, and third isolations 230, 240, 250 shown in FIG. 4 are recessed to form memory isolations 231, a logic isolation 241, and a boundary isolation 251. In some embodiments, step 104 may be implemented by immersing the structure of FIG. 4 in an etchant, for example, hydrofluoric acid (HF). Other suitable processes may be used for recessing the first, second, and third isolations 230, 240, 250. Each of the memory isolations 231, the logic isolation 241, and the boundary isolation 251 may independently be or include, for example, a shallow trench isolation (STI) structure, a deep trench isolation (DTI) structure, or other suitable isolation structures.

Figure 6:
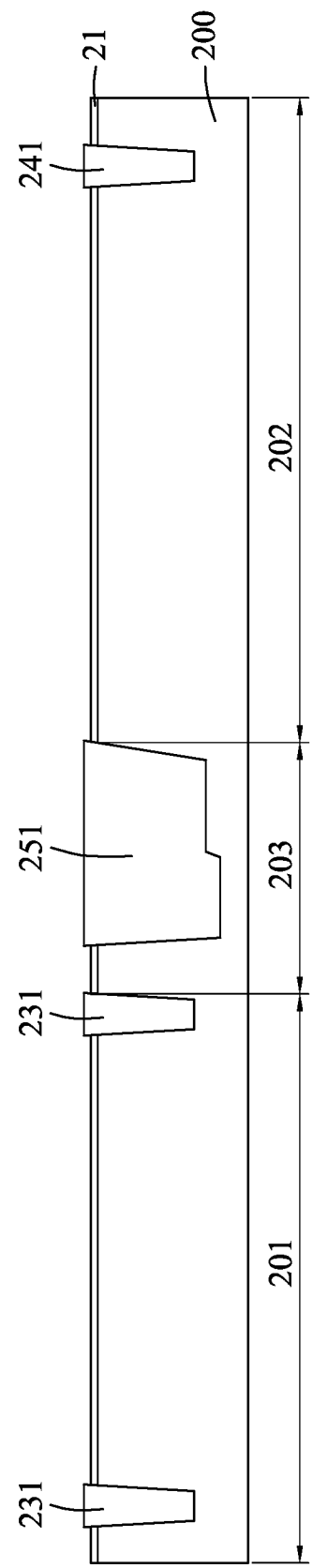

Referring to FIGS. 1A and 6, the method 100 proceeds to step 105, where the second pad layer 22 shown in FIG. 5 is removed. Step 105 may be implemented using, for example, dry etching, wet etching, or a combination thereof, to selectively remove the second pad layer 22. In some embodiments, step 105 may be implemented by immersing the structure of FIG. 5 in an etchant, for example, phosphoric acid ($H_3PO_4$). Other suitable processes may be used to remove the second pad layer 22.

Referring to FIGS. 1A and 7, the method 100 proceeds to step 106, a memory well 26 is formed at the memory substrate region 201 overlying a bulk semiconductor region 200a of the semiconductor substrate 200, and a first logic well 27 and a second logic well 28 are separately formed at the logic substrate region 202 overlying the bulk semiconductor region 200a. The memory well 26 is located at one side of the boundary isolation 251, and the first logic well 27 and the second logic well 28 are located at the other side of the boundary isolation 251. The memory well 26, the first logic well 27, and the second logic well 28 may be formed using ion implantation or other suitable techniques. The memory well 26 has a different doping type or concentration from the bulk semiconductor region 200a. Each of the first logic well 27 and the second logic well 28 has a different doping type or concentration from the bulk semiconductor region 200a. The memory well 26 may have a first conductivity type, and each of the first and second logic wells 27, 28 may have the first conductivity type or a second conductivity type opposite to the first type conductivity. In some embodiments, the memory well 26 is n-type or p-type, the first logic well 27 is p-type, and the second logic well 28 is n-type. In alternative embodiments, the memory well 26 is n-type or p-type, and both the first logic well 27 and the second logic well 28 are n-type or p-type. Other suitable variations for conductivity types of the memory well 26, the first logic well 27 and the second logic well 28 are within the contemplated scope of the present disclosure.

Referring to FIGS. 1A and 8, the method 100 proceeds to step 107, where the first pad layer 21 shown in FIG. 7 is removed. Step 107 may be implemented using an etching process, such as dry etching, wet etching, or a combination thereof. Other suitable processes may be used for removing the first pad layer 21.

Figure 9:
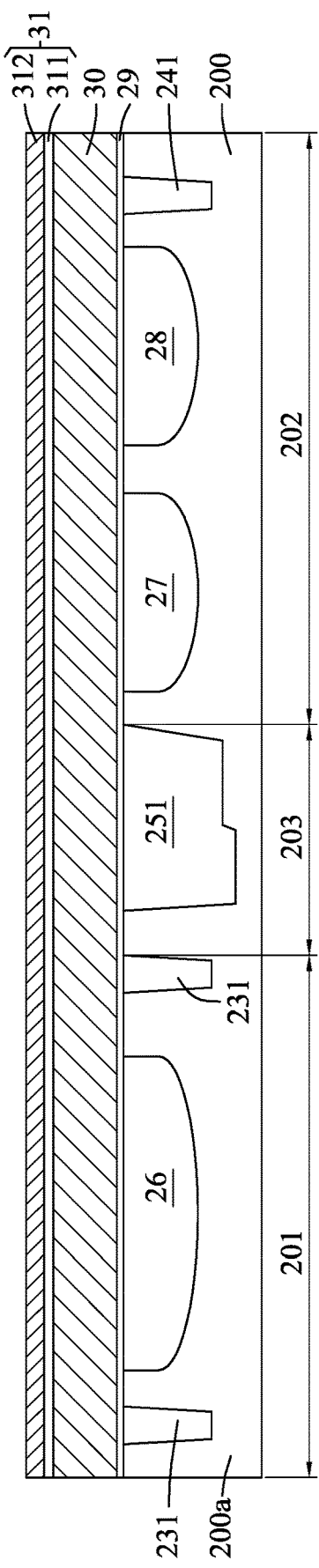

Referring to FIGS. 1A and 9, the method 100 proceeds to step 108, where a dummy dielectric layer 29, a dummy gate layer 30, and a hard mask layer 31 are sequentially formed on the structure of FIG. 8. The dummy dielectric layer 29 may include, for example, silicon oxide. The dummy gate layer 30 may include, for example, polysilicon. The hard mask layer 31 may include, for example, silicon oxide, silicon nitride, or silicon oxynitride. Other suitable materials for the dummy dielectric layer 29, the dummy gate layer 30, and the hard mask layer 31 are within the contemplated scope of the present disclosure. In some embodiments, the hard mask layer 31 includes a lower nitride layer 311 (including silicon nitride) and an upper oxide layer 312 (including silicon oxide). Each of the dummy dielectric layer 29, the dummy gate layer 30, and the hard mask layer 31 may be deposited by, for example, but not limited to, CVD, PVD, ALD, thermal oxidation, or other suitable techniques.

Figure 10:
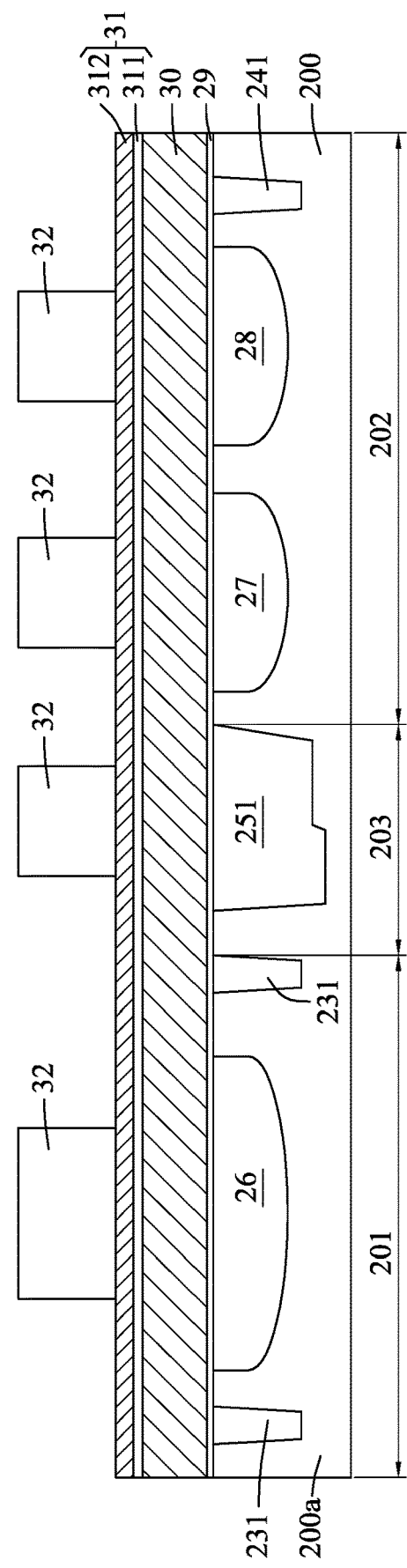
Figure 11:
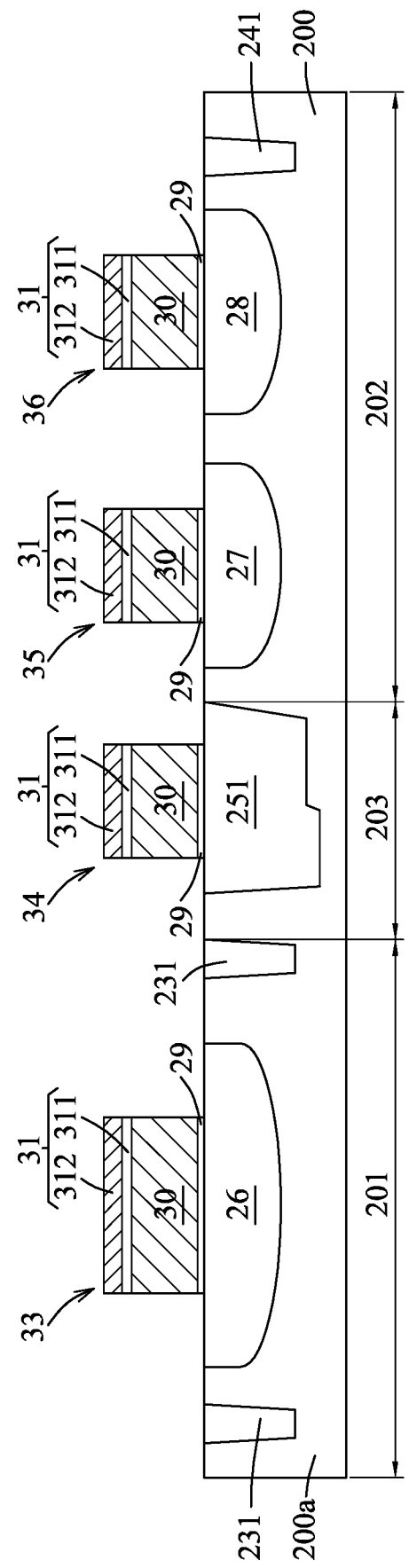

Referring to FIGS. 1A and 10, the method 100 proceeds to step 109, where a first patterned mask 32 is formed over the structure of FIG. 9. The first patterned mask 32 has a pattern corresponding to a layout of a dummy memory structure 33, a dummy wall 34, a first dummy logic structure 35, and a second dummy logic structure 36 which are shown in FIG. 11 and are formed in the subsequent step 110. The materials and processes for the first patterned mask 32 are similar to those for the patterned mask described in step 102, and therefore, the details thereof are omitted for the sake of brevity.

Referring to FIGS. 1A and 11, the method 100 proceeds to step 110, where the hard mask layer 31, the dummy gate layer 30, and the dummy dielectric layer 29 are patterned through the first patterned mask 32 shown in FIG. 10 to form the dummy memory structure 33, the dummy wall 34, the first dummy logic structure 35, and the second dummy logic structure 36. Step 110 may be implemented using dry etching, wet etching, or a combination thereof. After step 110, the first patterned mask 32 may be removed. Other suitable techniques may be used for patterning the hard mask layer 31, the dummy gate layer 30, and the dummy dielectric layer 29. The dummy wall 34 at the boundary substrate region 203 may be formed on the boundary isolation 251 in some embodiments, and may be formed on the bulk semiconductor region 200a in alternative embodiments. In some embodiments, the dummy wall 34 may have a rectangular cross section.

Figure 1B:
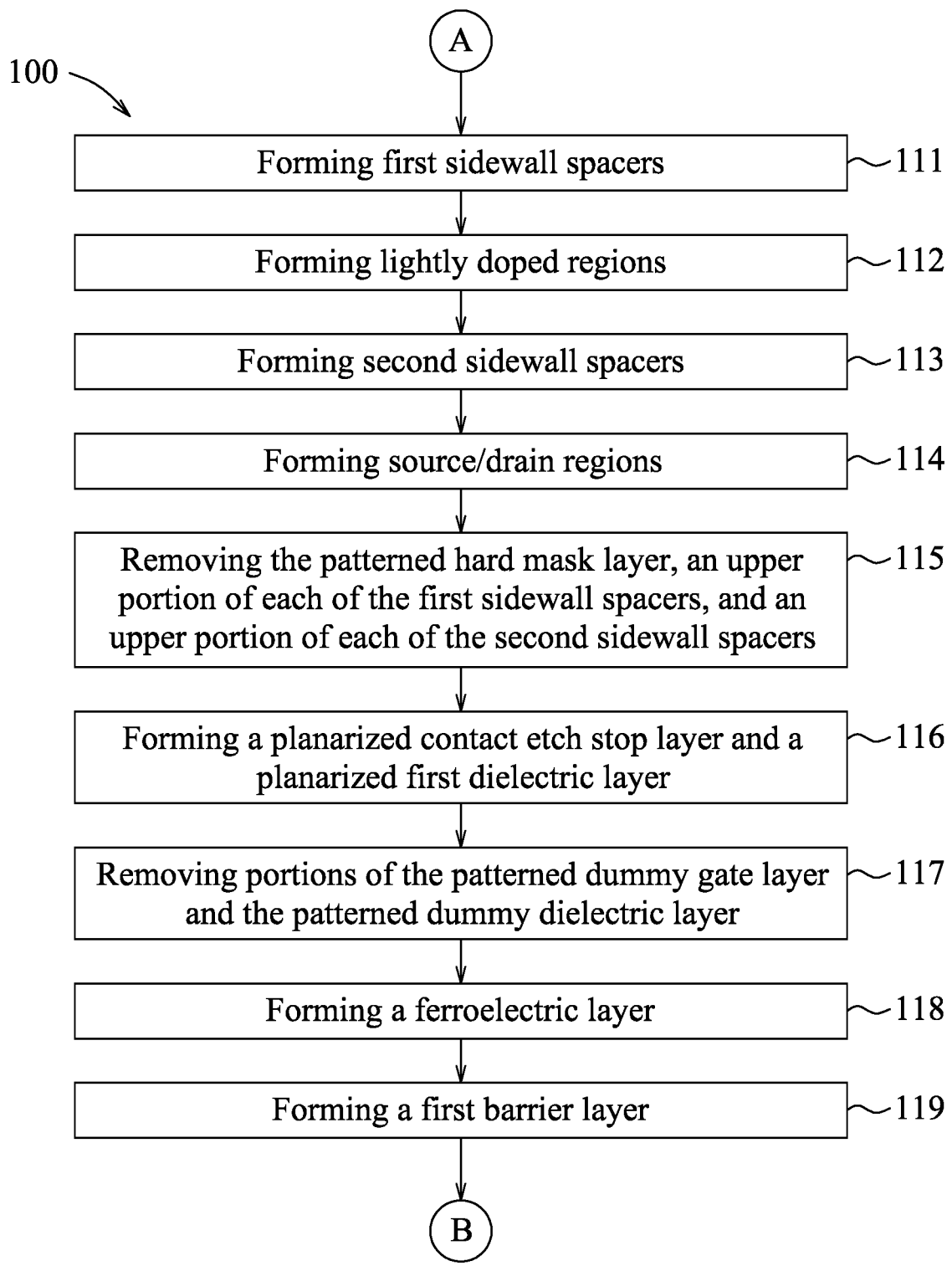

Referring to FIGS. 1B and 12, the method 100 proceeds to step 111, where four pairs of first sidewall spacers 371, 372, 373, 374 are formed. Each pair of the first sidewall spacers 371, 372, 373, 374 are respectively formed at two lateral sides of a corresponding one of the dummy memory structure 33, the first dummy logic structure 35, the second dummy logic structure 36, and the dummy wall 34. Step 111 includes (i) depositing a first spacer material (not shown) over the structure of FIG. 11 using, for example, CVD, PVD, ALD, or other suitable deposition techniques, and (ii) anisotropically etching (e.g., dry etching, wet etching, a combination thereof, or other suitable etching techniques) the first spacer material to thereby form the first sidewall spacers 371, 372, 373, 374. The first sidewall spacers 371, 372, 373, 374 may include, for example, silicon nitride. Other suitable materials for the first sidewall spacers 371, 372, 373, 374 are within the contemplated scope of the present disclosure.

Referring to FIGS. 1B and 13, the method 100 proceeds to step 112, where three pairs of lightly doped regions 381, 382, 383 are formed. Each pair of the lightly doped regions 381, 382, 383 are formed in two lateral regions of a corresponding one of the memory well 26, the first logic well 27, and the second logic well 28, respectively, and may have a conductivity type opposite to that of the corresponding one of the memory well 26, the first logic well 27, and the second logic well 28. In step 112, the two lateral regions of each of the memory well 26, the first logic well 27, and the second logic well 28 are exposed from and non-covered by (i) a corresponding one of the dummy memory structure 33, the first dummy logic structure 35, and the second dummy logic structure 36, and (ii) a corresponding pair of the first sidewall spacers 371, 372, 373. The lightly doped regions 381, 382, 383 may be formed using ion implantation, or other suitable techniques. In some embodiments, each of the lightly doped regions 381, 382, 383 may be a lightly doped source/drain (LDD).

Figure 14:
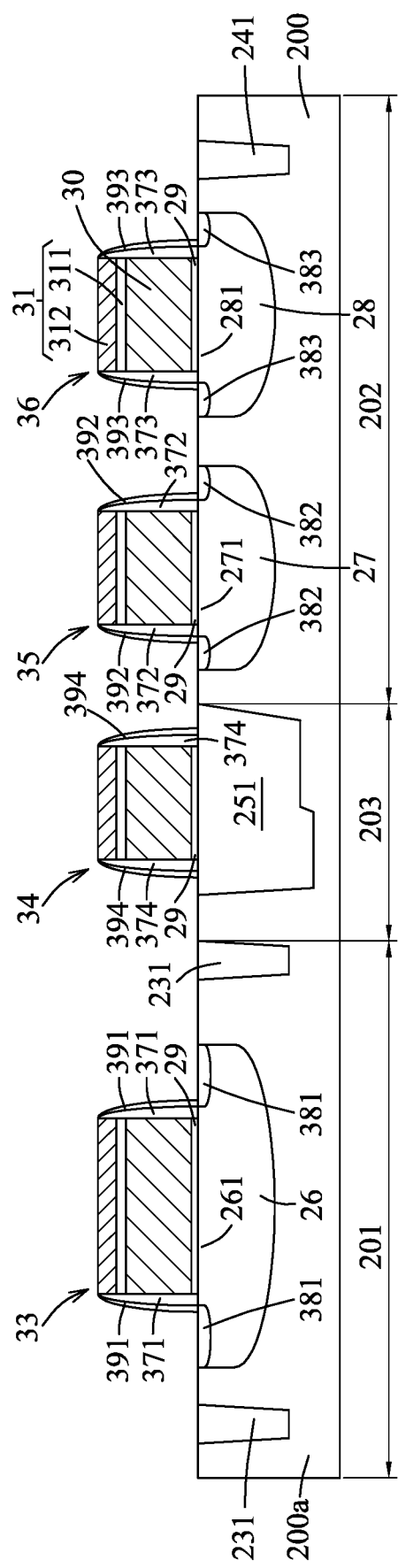

Referring to FIGS. 1B and 14, the method 100 proceeds to step 113, where four pairs of second sidewall spacers 391, 392, 393, 394 are formed. Each pair of the second sidewall spacers 391, 392, 393, 394 are formed on a corresponding pair of the first sidewall spacers 371, 372, 373, 374, respectively. Step 113 includes (i) depositing a second spacer material (not shown) over the structure of FIG. 13 using, for example, CVD, PVD, ALD, or other suitable deposition techniques, and (ii) anisotropically etching (e.g., dry etching, wet etching, a combination thereof, or other suitable etching techniques) the second spacer material to form the second sidewall spacers 391, 392, 393, 394. The second sidewall spacers 391, 392, 393, 394 may include, for example, silicon oxynitride. Other suitable materials for the second sidewall spacers 391, 392, 393, 394 are within the contemplated scope of the present disclosure. Each pair of the second sidewall spacers 391, 392, 393 are formed to partially cover a corresponding pair of the lightly doped regions 381, 382, 383, respectively.

Figure 15:
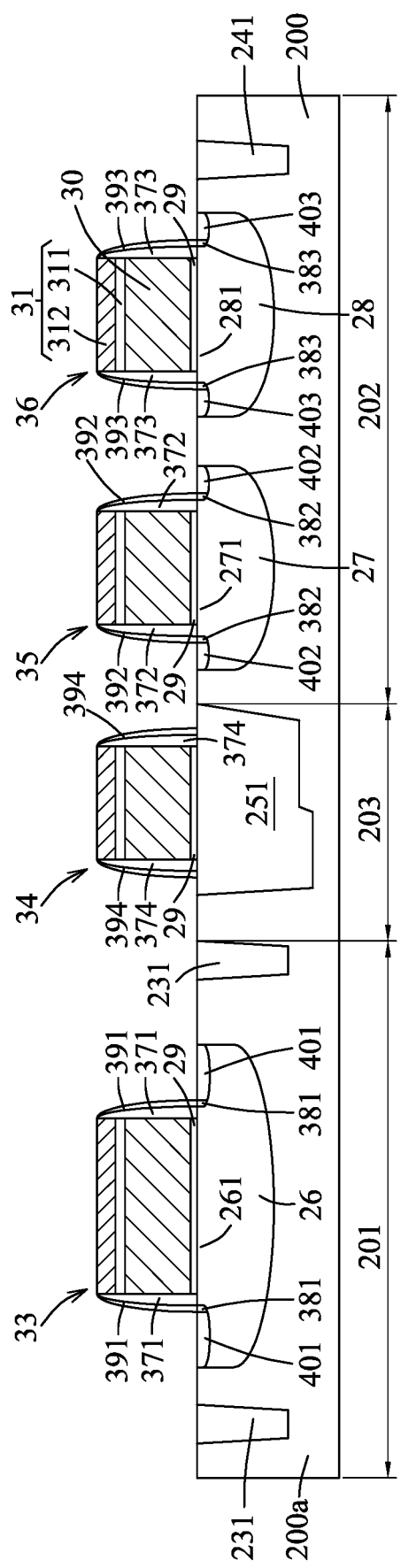

Referring to FIGS. 1B and 15, the method 100 proceeds to step 114, where three pairs of source/drain regions 401, 402, 403 are formed. Each pair of the source/drain regions 401, 402, 403 are formed in the two lateral regions of a corresponding one of the memory well 26, the first logic well 27 and the second logic well 28, respectively, and may have a conductivity type opposite to that of the corresponding one of the memory well 26, the first logic well 27 and the second logic well 28. In some embodiments, the source/drain regions 401, 402, 403 serve as memory source/drain regions, first logic source/drain regions, and second logic source/drain regions, respectively. In step 114, the two lateral regions of each of the memory well 26, the first logic well 27, and the second logic well 28 are exposed from and non-covered by (i) a corresponding one of the dummy memory structure 33, the first dummy logic structure 35, and the second dummy logic structure 36, (ii) a corresponding pair of the first sidewall spacers 371, 372, 373, and (iii) a corresponding pair of the second sidewall spacers 391, 392, 393. Each pair of the source/drain regions 401, 402, 403 may be located to respectively and partially overlap a corresponding pair of the lightly doped regions 381, 382, 383, and may have a conductivity type which is the same as that of a corresponding pair of the lightly doped regions 381, 382, 383. Each pair of the source/drain regions 401, 402, 403 may be p-type or n-type doped regions, and may have a doping concentration greater than that of a corresponding pair of the lightly doped regions 381, 382, 383, respectively. Each pair of the source/drain regions 401, 402, 403 may be formed using ion implantation, or other suitable techniques. After step 114, a memory channel region 261 is formed between the memory source/drain regions 401, a first logic channel region 271 is formed between the first logic source/drain regions 402, and a second logic channel region 281 is formed between the second logic source/drain regions 403.

Each of the lightly doped regions 381 is disposed between the memory channel region 261 and a corresponding one of the memory source/drain regions 401. Each of the lightly doped regions 382 is disposed between the first logic channel region 271 and a corresponding one of the first logic source/drain regions 402. Each of the lightly doped regions 383 is disposed between the second logic channel region 281 and a corresponding one of the second logic source/drain regions 403.

Figure 16:
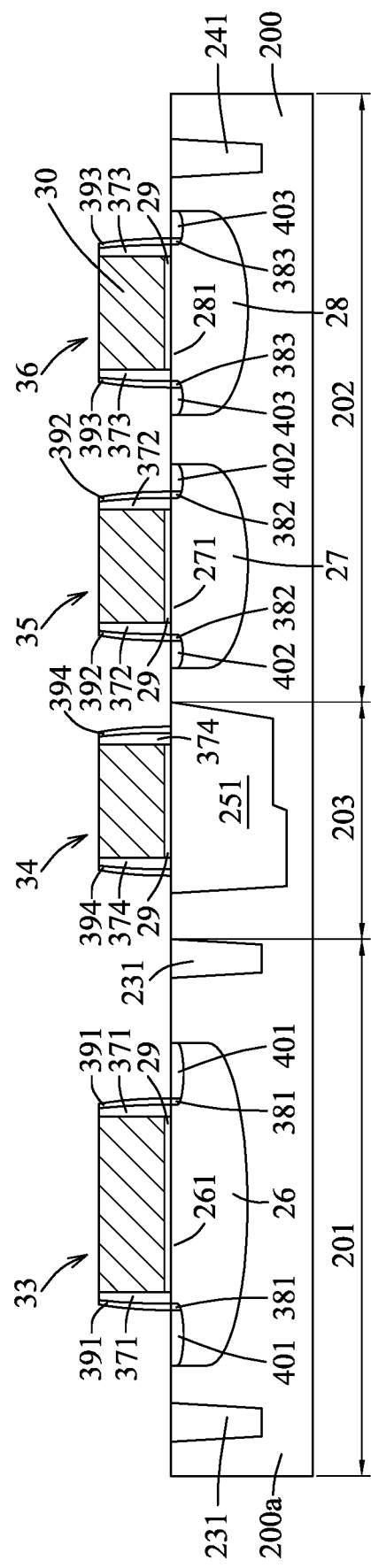

Referring to FIGS. 1B and 16, the method 100 proceeds to step 115, where the patterned hard mask layer 31, an upper portion of each of the first sidewall spacers 371, 372, 373, 374, and an upper portion of each of the second sidewall spacers 391, 392, 393, 394 are removed. Step 115 may be implemented using a planarization process, such as a CMP process or other suitable processes.

Figure 17:
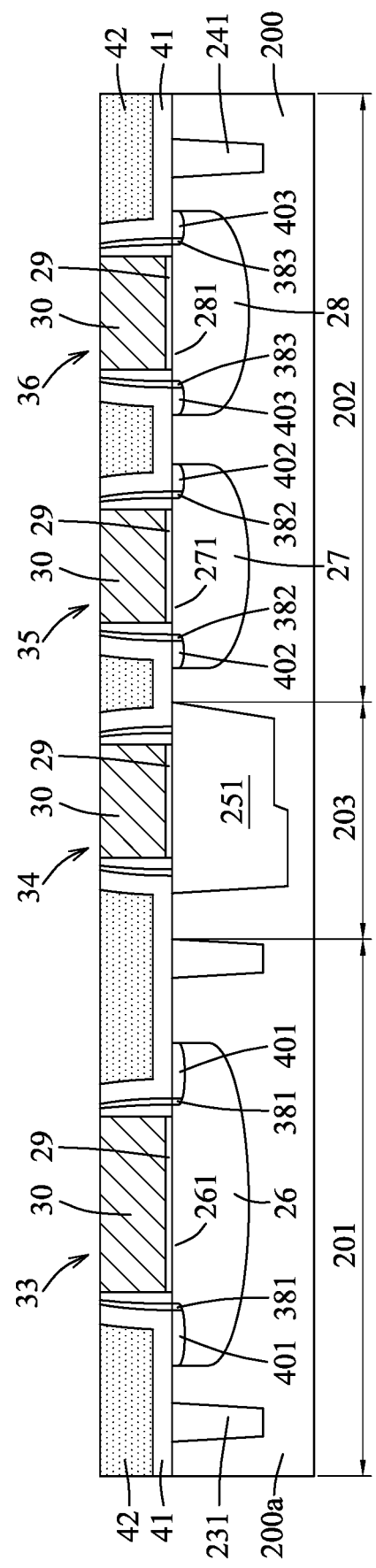

Referring to FIGS. 1B and 17, the method 100 proceeds to step 116, where a planarized contact etch stop layer (planarized CESL) 41 and a planarized first dielectric layer 42 are sequentially formed after step 115. Step 116 includes (i) conformally depositing a CESL (not shown) over the structure of FIG. 16 using, for example, CVD, plasma-enhanced chemical vapor deposition (PECVD), ALD, spin-on coating, electroless plating, or other suitable deposition techniques, (ii) conformally depositing a first dielectric layer (not shown) on the non-shown CESL using, for example, CVD, PVD, or other suitable deposition techniques, and (iii) conducting a planarization process, such as a CMP process or other suitable processes, to remove the excess CESL and the excess first dielectric layer to expose the patterned dummy gate layer 30, thereby forming the planarized CESL 41 and the planarized first dielectric layer 42. The planarized CESL 41 may include, but not limited to, metal nitride, metal oxide, metal carbide, silicon nitride, silicon oxide, silicon carbide, silicon oxynitride, or combinations thereof. Other suitable materials for the planarized CESL 41 are within the contemplated scope of the present disclosure. The planarized first dielectric layer 42 may include, but not limited to, silicon oxide, silicon nitride, silicon carbide, silicon oxycarbide, silicon oxynitride, silicon carbonitride, silicon oxycarbonitride, undoped silicate glass (USG), phosphosilicate glass (PSG), borosilicate glass (BSG), boron-doped phosphosilicate glass (BPSG), fluorine-doped silicate glass (FSG), extreme low dielectric constant (k) material, other suitable dielectric materials, or combinations thereof.

Figure 18:
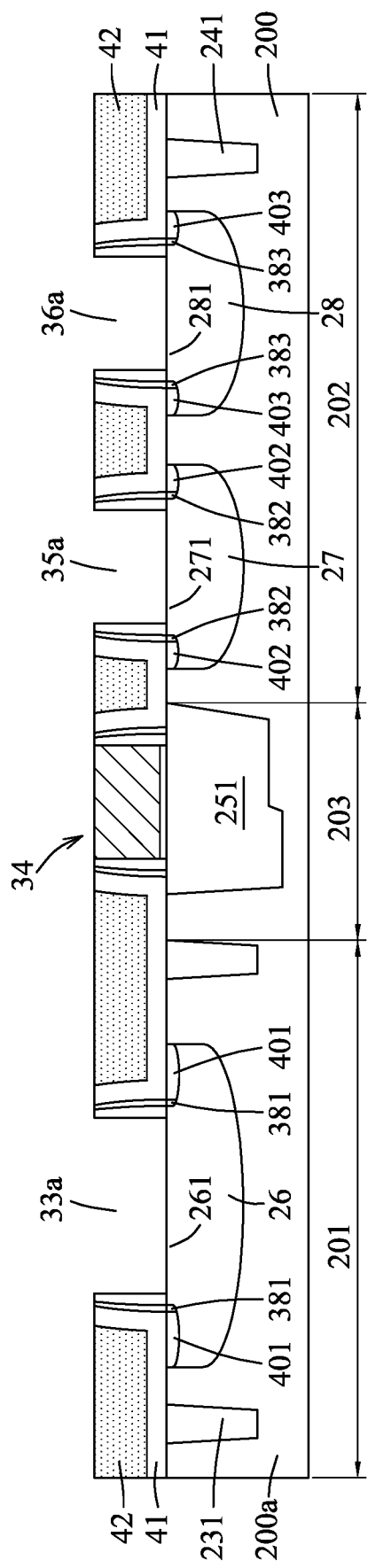

Referring to FIGS. 1B and 18, the method 100 proceeds to step 117, where portions of the patterned dummy gate layer 30 and portions of the patterned dummy dielectric layer 29 (see FIG. 17) at the dummy memory structure 33, the first dummy logic structure 35, and the second dummy logic structure 36 are removed. Step 117 may include (i) forming a patterned mask (not shown) over the structure of FIG. 17 to expose the portions of the patterned dummy gate layer 30, (ii) etching the dummy gate layer 30 and the dummy dielectric layer 29 through the patterned mask, and (iii) removing the patterned mask. The etching may be implemented using dry etching, wet etching, or a combination thereof. The patterned mask may be similar to that described in step 102. After step 117, a patterned dielectric structure is formed on the semiconductor substrate 200, and includes the planarized first dielectric layer 42, the planarized CESL 41, and the sidewall spacers 371-374, 391-394 (see FIG. 16). A first recess 33a which exposes the memory channel region 261 and two second recesses 35a, 36a which expose the logic channel regions 271, 281 are formed in the patterned dielectric structure.

Figure 19:
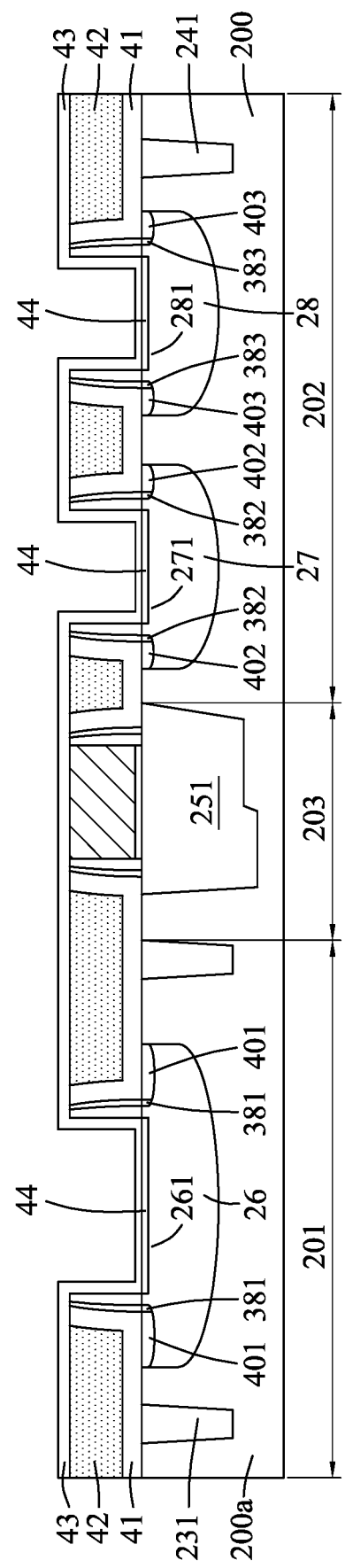

Referring to FIGS. 1B and 19, the method 100 proceeds to step 118, where a ferroelectric layer 43 is conformally formed over the structure of the FIG. 18. The ferroelectric layer 43 includes a ferroelectric material, and may include binary oxides, ternary oxides, quaternary oxides, other suitable oxides, or combinations thereof. The binary oxides may include, for example, but not limited to, hafnium oxide (hafnia, $HfO_2$) or other suitable materials. The ternary oxides may include, for example, but not limited to, hafnium silicate ($HfSiO_x$), hafnium zirconate ($HfZrO_x$), barium titanate ($BaTiO_3$), lead titanate ($PbTiO_3$), strontium titanate ($SrTiO_3$), calcium manganite ($CaMnO_3$), bismuth ferrite ($BiFeO_3$), aluminum scandium nitride (AlScN), aluminum gallium nitride (AlGaN), aluminum yttrium nitride (AlYN), doped $HfO_2$ (the dopants may include Si, La, Y, Sc, Ga, Gd, combinations thereof, or other suitable dopants), other suitable materials, or combinations thereof. The quaternary oxides may include, for example, but not limited to, lead zirconate titanate ($PbZr_xTi_yO_z$), barium strontium titanate ($BaSrTiO_x$), strontium bismuth tantalate ($SrBi_2Ta_2O_9$), or combinations thereof. Other suitable ferroelectric materials for the ferroelectric layer 43 are within the contemplated scope of the present disclosure. The ferroelectric layer 43 may be formed using, for example, CVD, PVD, ALD, plasma-enhanced ALD, molecular beam epitaxy (MBE), or other suitable deposition techniques. In some embodiments, the ferroelectric layer 43 may have a thickness ranging from about 50 Å to about 150 Å. In some embodiments, before forming the ferroelectric layer 43, a first interfacial layer 44 may be optionally formed in the memory well 26, the first logic well 27, and the second logic well 28 using, for example, thermal oxidation, or other suitable techniques. In some embodiments, the ferroelectric layer 43 is conformally deposited over the patterned dielectric structure along the surface of the first recess 33a and along the surfaces of the second recesses 35a, 36a.

Figure 20:
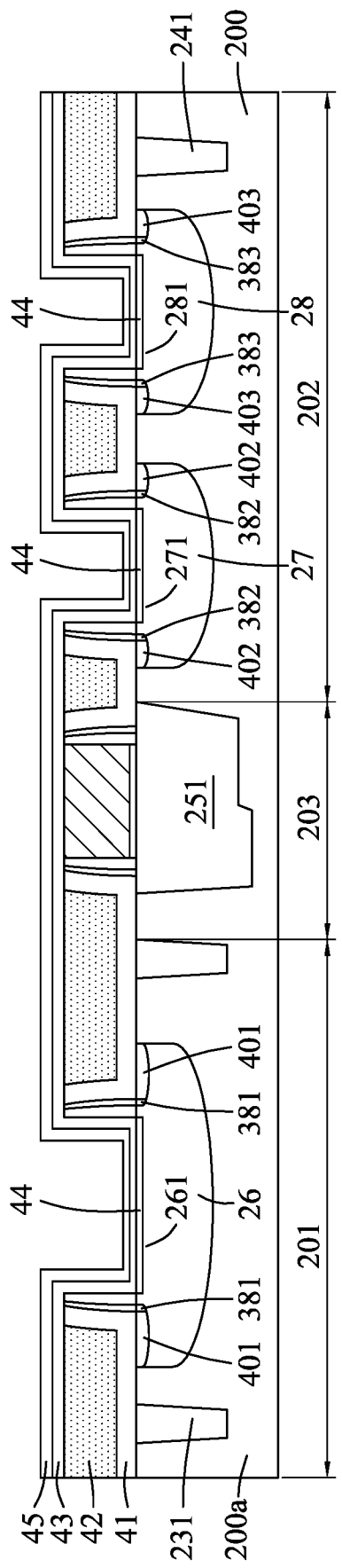

Referring to FIGS. 1B and 20, the method 100 proceeds to step 119, where a first barrier layer 45 is conformally formed over the structure of FIG. 19. The first barrier layer 45 may include titanium nitride. Other suitable materials for the first barrier layer 45 are within the contemplated scope of the present disclosure. The first barrier layer 45 may be formed using, for example, CVD, PVD, ALD, or other suitable techniques. The provision of the first barrier layer 45 may prevent direct annealing of the ferroelectric layer 43 in a subsequent process, and may prevent oxygen gas from being in contact with the ferroelectric layer 43 and the first interfacial layer 44.

Figure 1C:
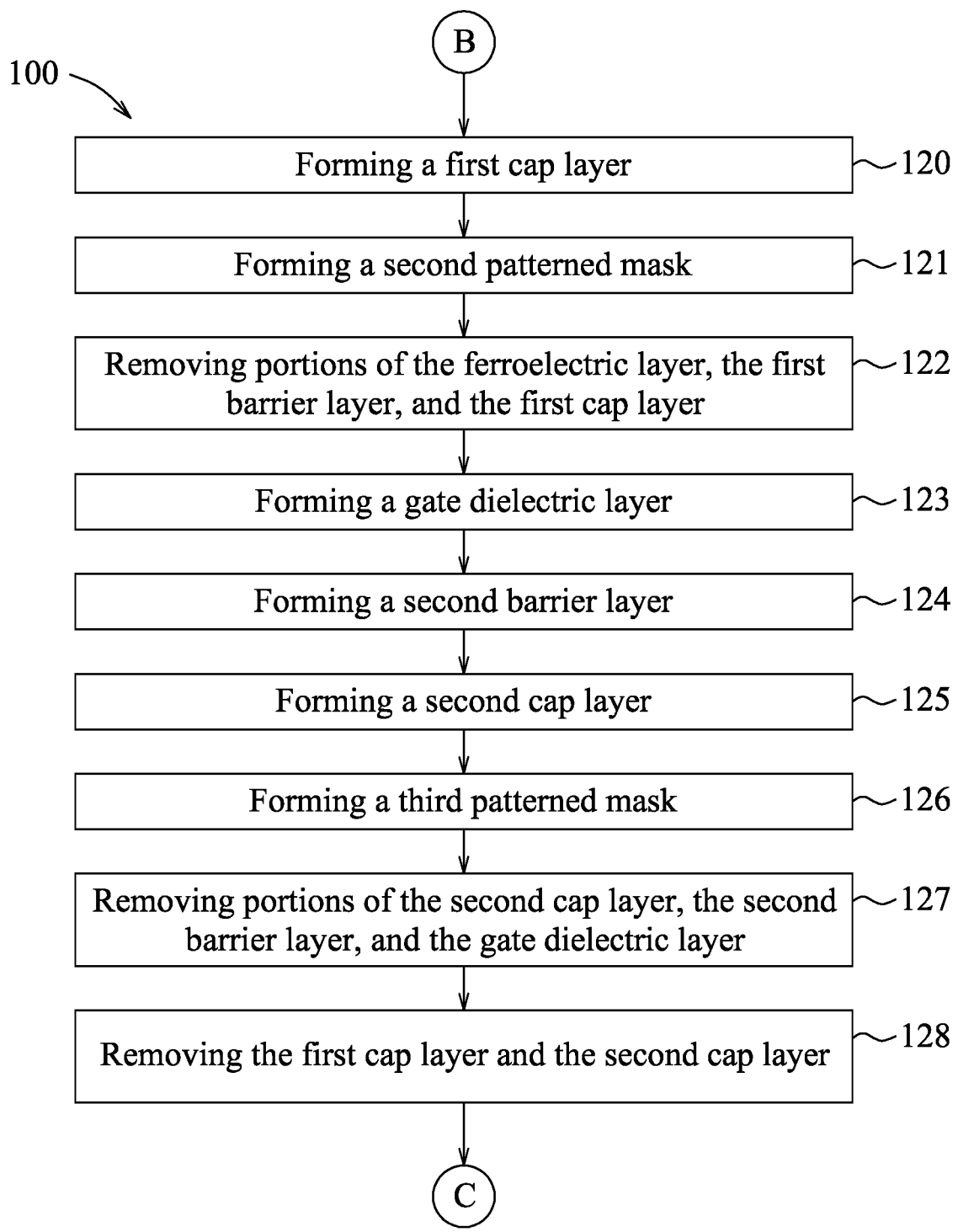
Figure 21:
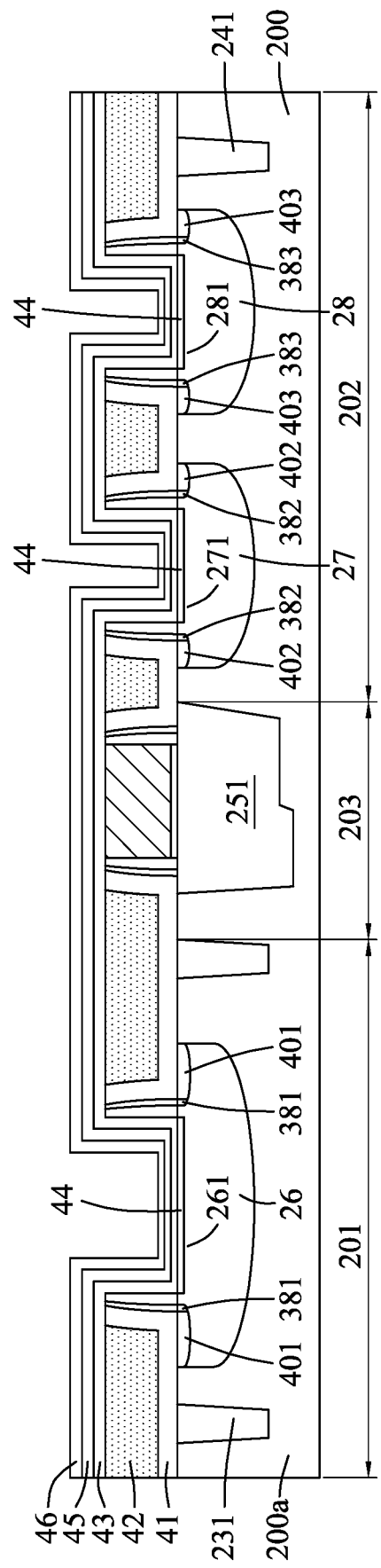

Referring to FIGS. 1C and 21, the method 100 proceeds to step 120, where a first cap layer 46 is conformally formed over the structure of FIG. 20. The first cap layer 46 may include silicon. The other suitable materials for the first cap layer 46 are within the contemplated scope of the present disclosure. The first cap layer 46 may be formed using, for example, CVD, PVD, ALD, or other suitable techniques. The provision of the first cap layer 46 may prevent oxidation of the first barrier layer 45, and the provision of the first barrier layer 45 may also prevent silicon in the first cap layer 46 from being reacted with the ferroelectric layer 43.

Figure 22:
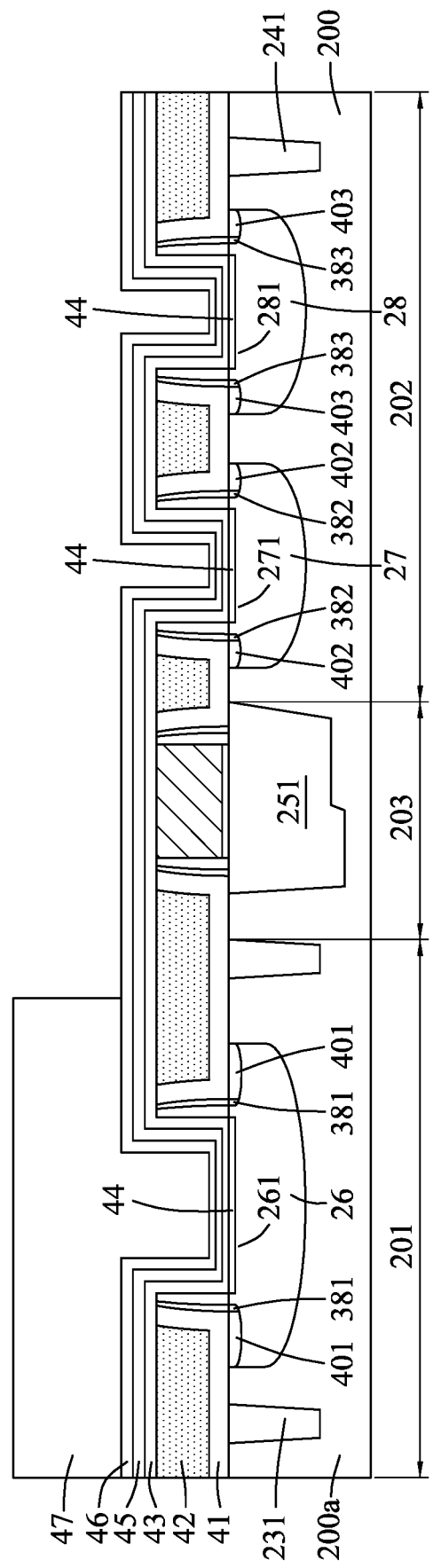

Referring to FIGS. 1C and 22, the method 100 proceeds to step 121, where a second patterned mask 47 is formed over the structure of FIG. 21 to cover the layers on the memory substrate region 201 and to expose the layers on the logic substrate region 202 and the boundary substrate region 203. In some embodiments, the second patterned mask 47 is formed to fully cover the layers above the memory well 26. The materials and processes for the second patterned mask 47 are similar to those for the patterned mask described in step 102, and therefore, the details thereof are omitted for the sake of brevity.

Figure 23:
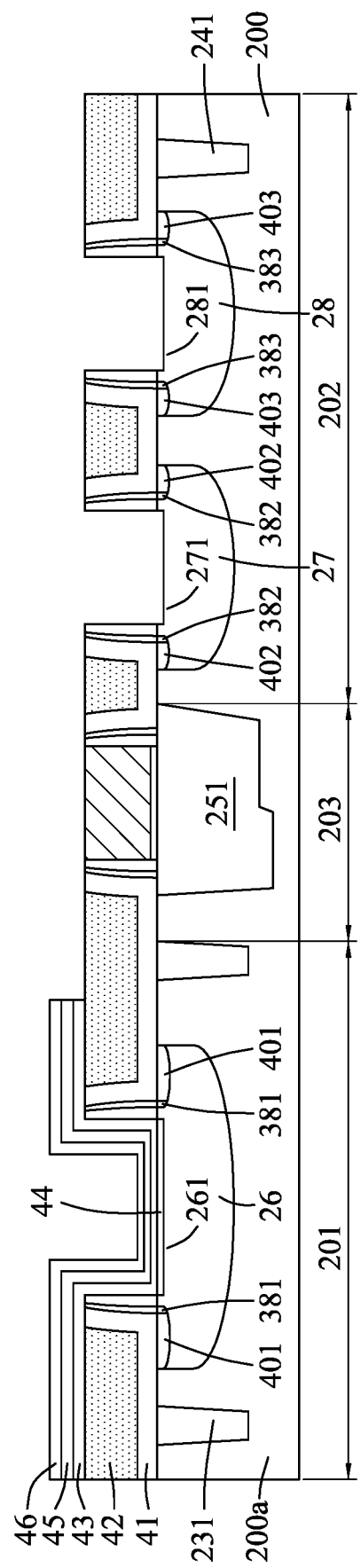

Referring to FIGS. 1C and 23, the method 100 proceeds to step 122, where portions of the ferroelectric layer 43, the first barrier layer 45, and the first cap layer 46 which are exposed from the second patterned mask 47 are removed. In addition, portions of the first interfacial layer 44 in the logic substrate region 202 shown in FIG. 22, if any, are also removed. Step 122 may be implemented using, for example, dry etching, wet etching, or a combination thereof. Afterwards, the second patterned mask 47 is removed. In some embodiments, in step 122, the ferroelectric layer 43 shown in FIG. 22 is partially removed such that a first ferroelectric portion of the ferroelectric layer 43 is left on the memory substrate region 201.

Figure 24:
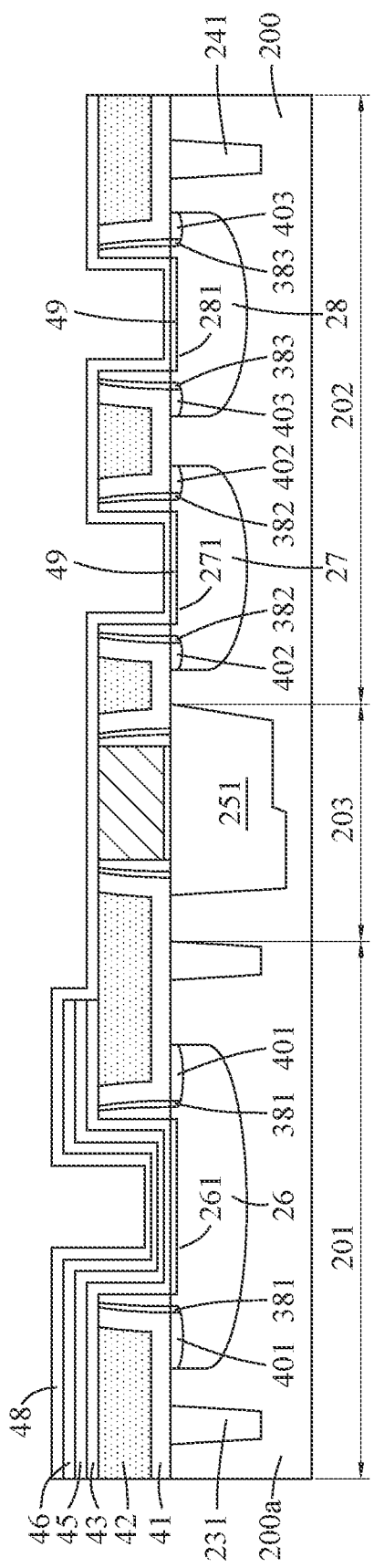

Referring to FIGS. 1C and 24, the method 100 proceeds to step 123, where a gate dielectric layer 48 is conformally formed over the structure of FIG. 23. The gate dielectric layer 48 may include, but not limited to, tantalum oxide ($Ta_2O_5$), titanium oxide ($TiO_2$), hafnium oxide ($HfO_2$), aluminum oxide ($Al_2O_3$), zirconium oxide ($ZrO_2$), hafnium silicate ($HfSiO_x$), zirconium silicate ($ZrSiO_4$), lanthanum oxide ($La_2O_3$), praseodymium oxide ($Pr_2O_3$), other suitable high-k materials, or combinations thereof. Other suitable materials for the gate dielectric layer 48 are within the contemplated scope of the present disclosure. The gate dielectric layer 48 may be formed using, for example, CVD, PVD, ALD, or other suitable techniques. In some embodiments, the gate dielectric layer 48 may have a thickness ranging from about 5 Å to about 30 Å. In some embodiments, before forming the gate dielectric layer 48, a second interfacial layer 49 may be optionally formed in the first logic well 27 and the second logic well 28 using, for example, thermal oxidation, or other suitable techniques. In some embodiments, the gate dielectric layer 48 is conformally deposited over the patterned dielectric structure, on the first ferroelectric portion of the ferroelectric layer 43, and along the surfaces of the second recesses 35a, 36a (See FIG. 18).

Figure 25:
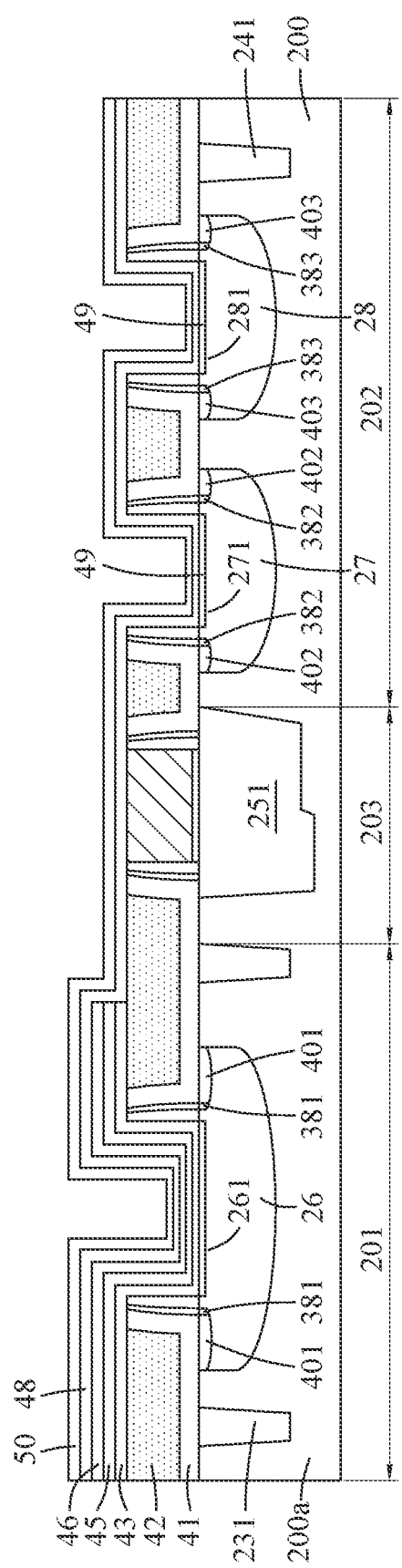

Referring to FIGS. 1C and 25, the method 100 proceeds to step 124, where a second barrier layer 50 is conformally formed over the structure of FIG. 24. The second barrier layer 50 may include titanium nitride. Other suitable materials for the second barrier layer 50 are within the contemplated scope of the present disclosure. The second barrier layer 50 may be formed using, for example, CVD, PVD, ALD, or other suitable techniques. The provision of the second barrier layer 50 may prevent direct annealing of the gate dielectric layer 48 in a subsequent process, and may prevent oxygen gas from being in contact with the gate dielectric layer 48 and the second interfacial layer 49.

Figure 26:
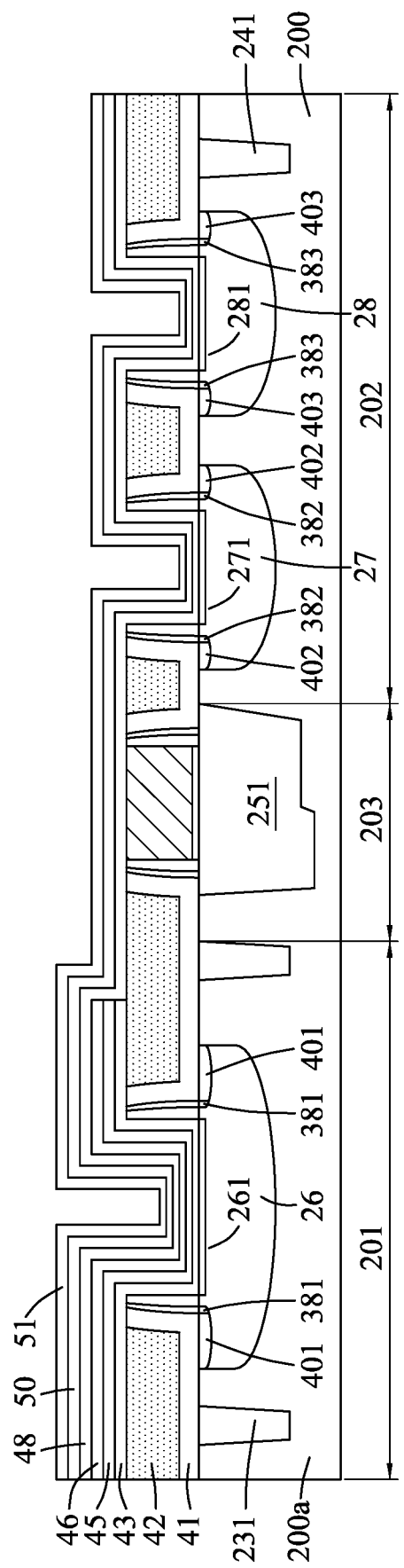

Referring to FIGS. 1C and 26, the method 100 proceeds to step 125, where a second cap layer 51 is conformally formed over the structure of FIG. 25. The second cap layer 51 may include silicon. The other suitable materials for the second cap layer 51 are within the contemplated scope of the present disclosure. The second cap layer 51 may be formed using, for example, CVD, PVD, ALD, or other suitable techniques. In some embodiments, an annealing treatment may be optionally implemented after step 125. The provision of the second cap layer 51 may prevent oxidation of the second barrier layer 50, and the provision of the second barrier layer 50 may also prevent silicon in the second cap layer 51 from being reacted with the gate dielectric layer 48.

Figure 27:
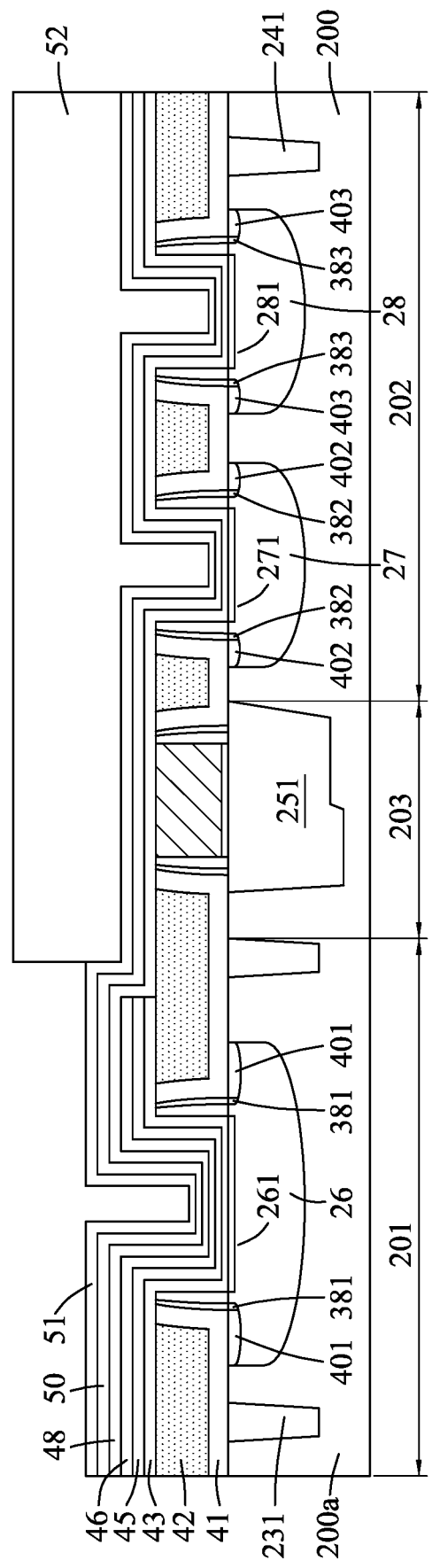

Referring to FIGS. 1C and 27, the method 100 proceeds to step 126, where a third patterned mask 52 is formed over the structure of FIG. 26 to cover the layers on the logic substrate region 202 and the boundary substrate region 203 and to expose the layers on the memory substrate region 201. In some embodiments, the layers on the memory well 26 are exposed from the third patterned mask 52. The materials and processes for the third patterned mask 52 are similar to those for the patterned mask described in step 102, and the details thereof hence are omitted for the sake of brevity.

Figure 28:
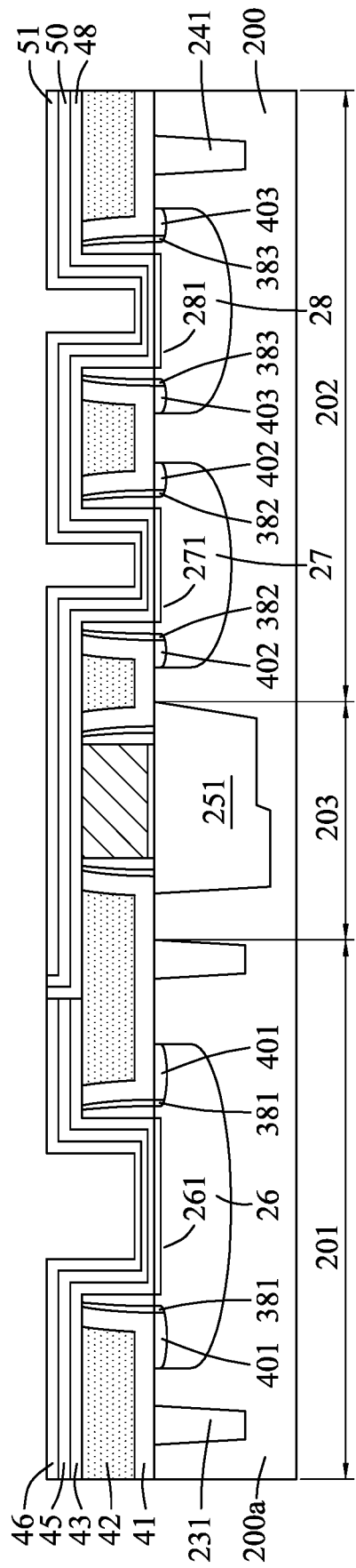

Referring to FIGS. 1C and 28, the method 100 proceeds to step 127, where portions of the second cap layer 51, the second barrier layer 50, and the gate dielectric layer 48 which are exposed from the third patterned mask 52 (see FIG. 27) are removed. Step 127 may be implemented using, for example, dry etching, wet etching, or a combination thereof. Afterwards, the third patterned mask 52 is removed.

Figure 29:
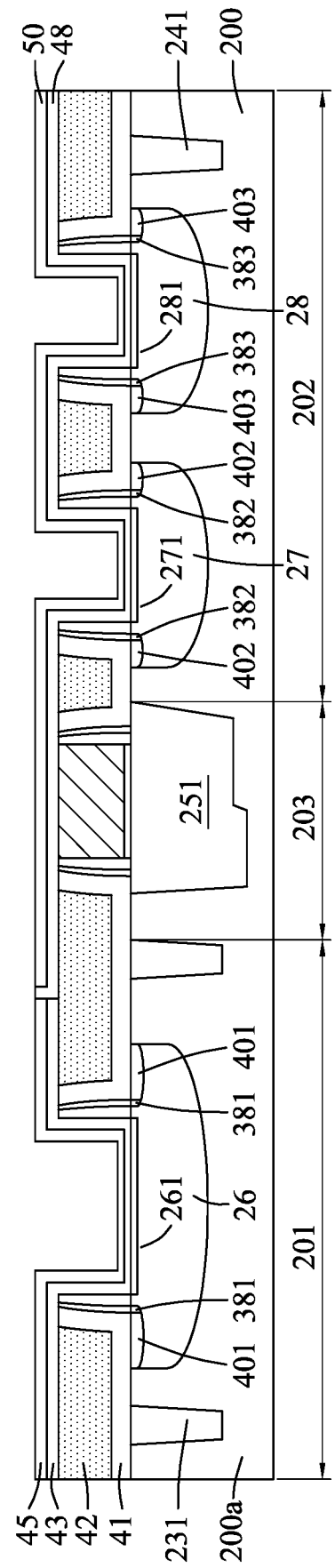

Referring to FIGS. 1C and 29, the method 100 proceeds to step 128, where the first cap layer 46 and the second cap layer 51 are removed. In addition, portions of the gate dielectric layer 48 and the second barrier layer 50 disposed between the first cap layer 46 and the second cap layer 51 may also be removed. Step 128 may be implemented using, for example, dry etching, wet etching, or a combination thereof.

Figure 1D:
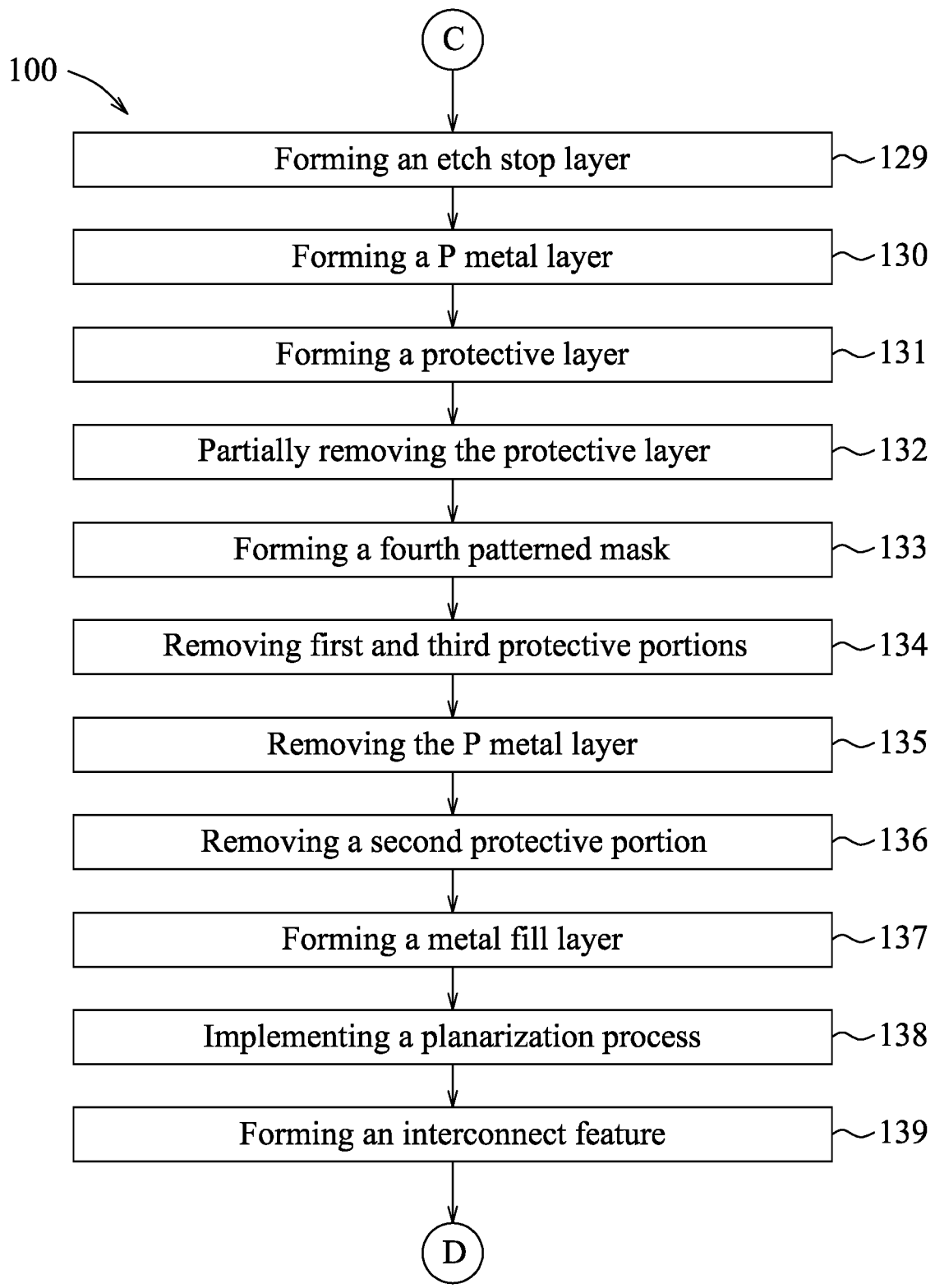
Figure 30:
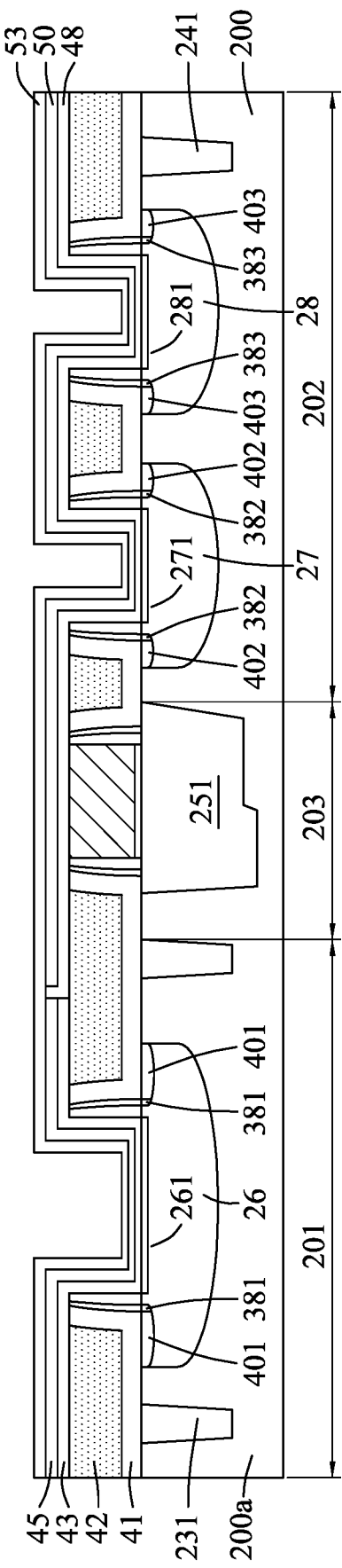

Referring to FIGS. 1D and 30, the method 100 proceeds to step 129, where an etch stop layer 53 is conformally formed over the structure of FIG. 29. The etch stop layer 53 may include tantalum nitride. Other suitable materials for the etch stop layer 53 are within the contemplated scope of the present disclosure. The etch stop layer 53 may be formed using, for example, CVD, PVD, ALD, or other suitable techniques.

Figure 31:
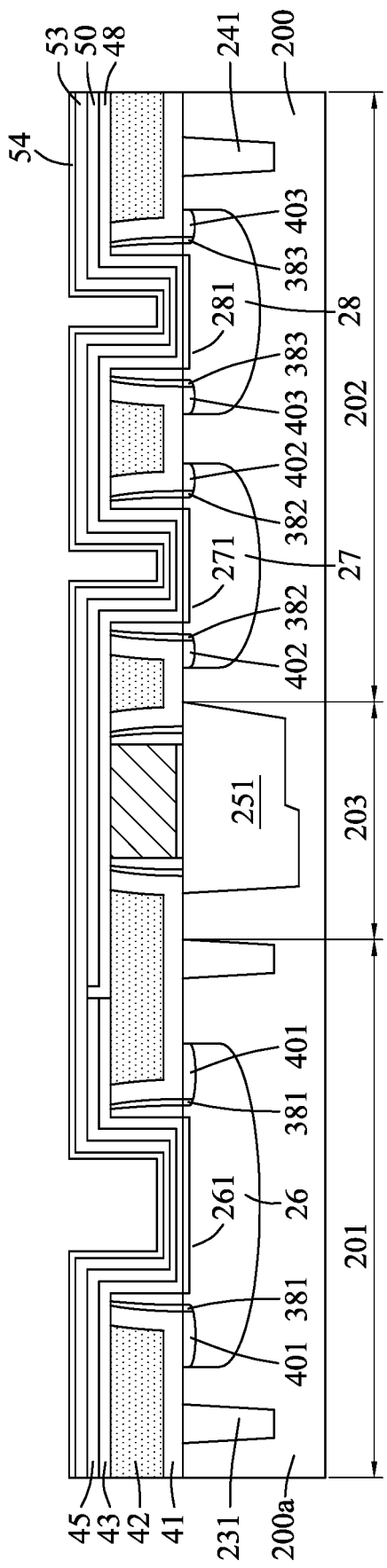

Referring to FIGS. 1D and 31, the method 100 proceeds to step 130, where a P metal layer 54 is conformally formed over the structure of FIG. 30. The P metal layer 54 may include titanium nitride. Other suitable materials for the P metal layer 54 are within the contemplated scope of the present disclosure. The P metal layer 54 may be formed using, for example, CVD, PVD, ALD, or other suitable techniques.

Figure 32:
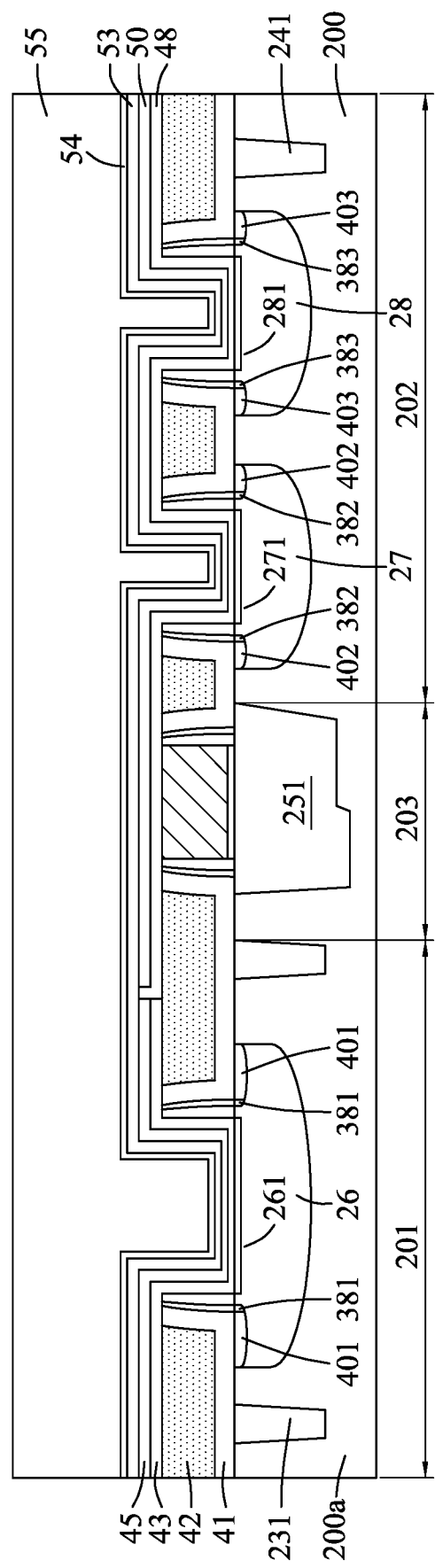

Referring to FIGS. 1D and 32, the method 100 proceeds to step 131, where a protective layer 55 is formed over the structure of FIG. 31. Step 131 may include (i) depositing a dielectric material layer over the structure of FIG. 31, and (ii) conducting a planarization process, such as a CMP process or other suitable techniques, so as to obtain the protective layer 55. The protective layer 55 may include a dielectric material, for example, spin on glass (SOG, a silicon oxide based polysiloxane). Other suitable materials for the protective layer 55 are within the contemplated scope of the present disclosure.

Figure 33:
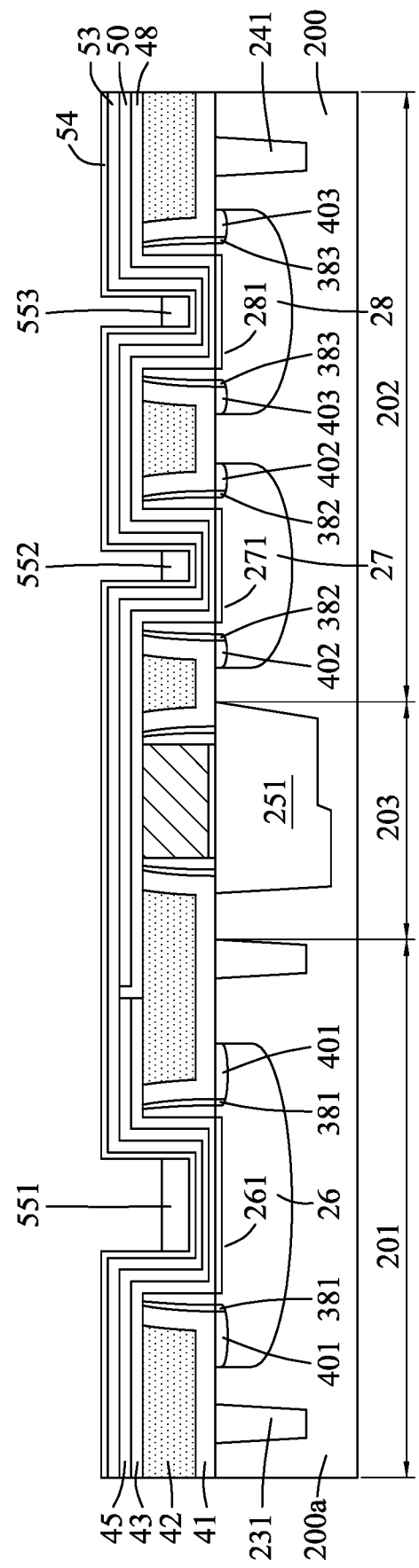

Referring to FIGS. 1D and 33, the method 100 proceeds to step 132, where the protective layer 55 is partially removed to leave first, second, and third protective portions 551, 552, 553 of the protective layer 55 respectively above the memory well 26, the first logic well 27, and the second logic well 28 and to expose upper portions of the P metal layer 54. Step 132 may be implemented by using, for example, dry etching, wet etching, or a combination thereof. Other suitable techniques may be used for partially removal of the protective layer 55.

Figure 34:
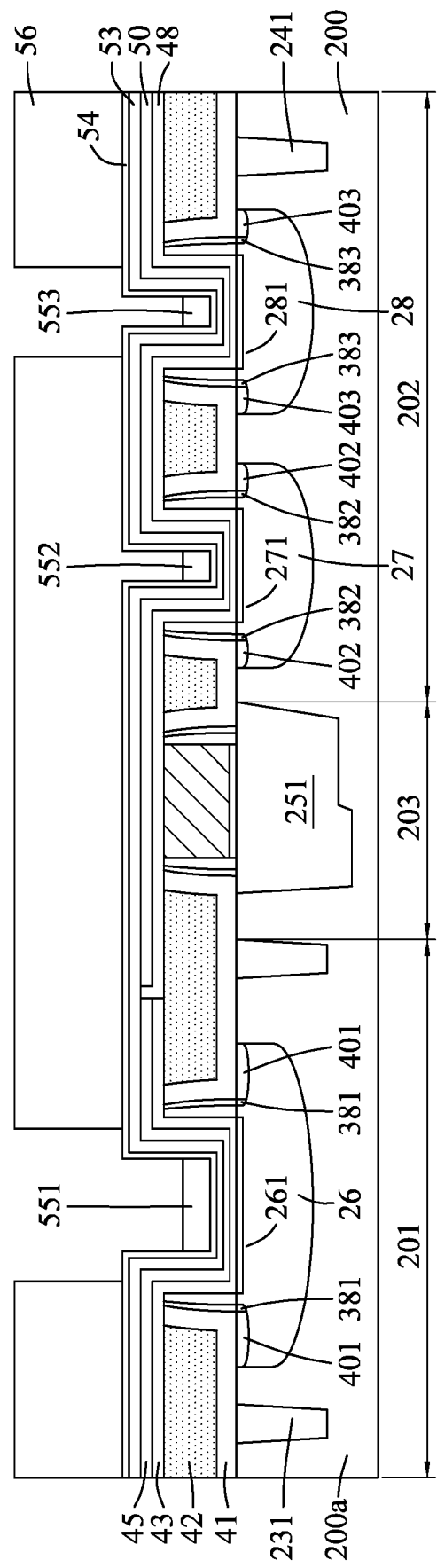

Referring to FIGS. 1D and 34, the method 100 proceeds to step 133, where a fourth patterned mask 56 is formed over the structure of FIG. 33 to expose the first and third protective portions 551, 553. The materials and processes for the fourth patterned mask 56 are similar to those for the patterned mask described in step 102, and the details thereof are hence omitted for the sake of brevity.

Figure 35:
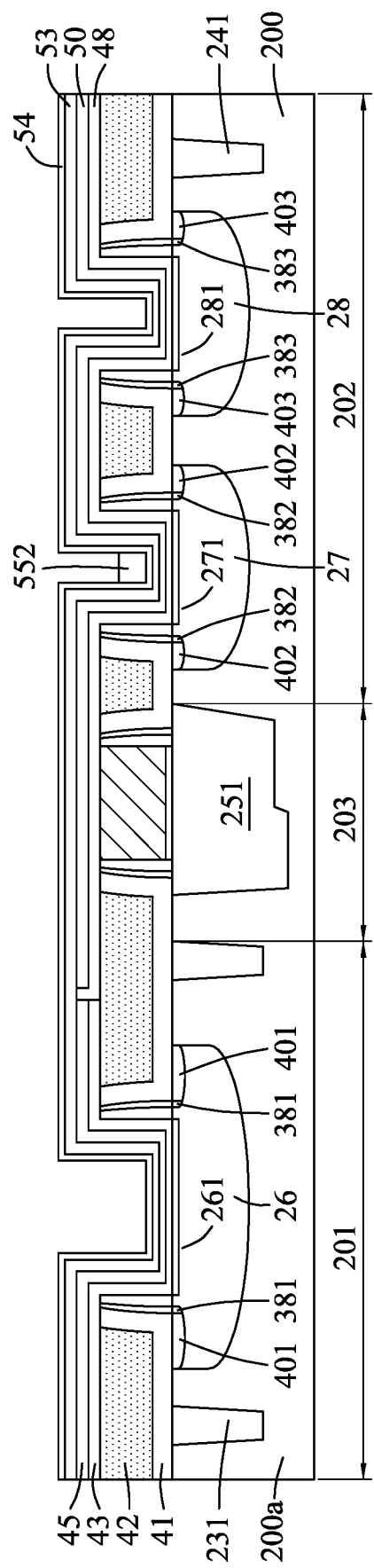

Referring to FIGS. 1D and 35, the method 100 proceeds to step 134, where the first and third protective portions 551, 553 are removed through the fourth patterned mask 56 shown in FIG. 34. Step 134 may be implemented by using, for example, dry etching, wet etching, or a combination thereof. Afterwards, the fourth patterned mask 56 is removed.

Figure 36:
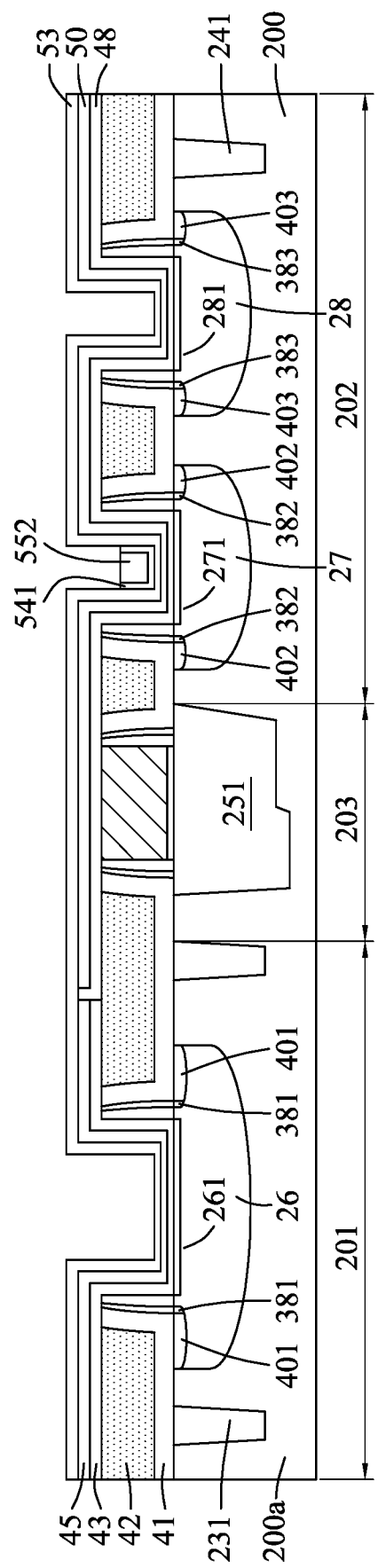

Referring to FIGS. 1D and 36, the method 100 proceeds to step 135, where the P metal layer 54 shown in FIG. 35 is removed to expose the etch stop layer 53, thereby leaving a P metal portion 541 which is disposed between the second protective portion 552 and the etch stop layer 53. Step 135 may be implemented by using, for example, dry etching, wet etching, or a combination thereof.

Figure 37:
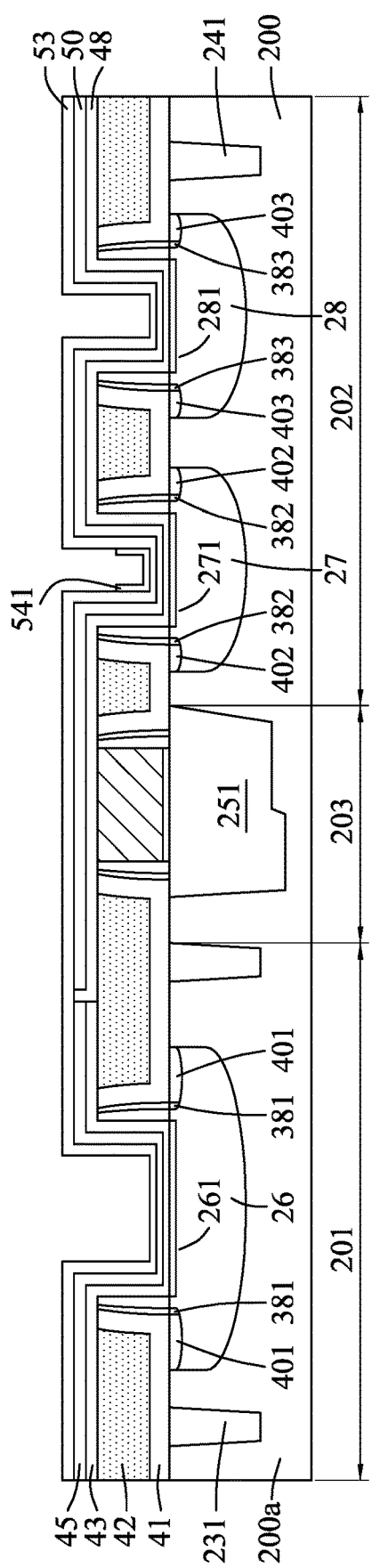

Referring to FIGS. 1D and 37, the method 100 proceeds to step 136, where the second protective portion 552 shown in FIG. 36 is removed. Step 136 may be implemented by using, for example, dry etching, wet etching, or a combination thereof.

Figure 38:
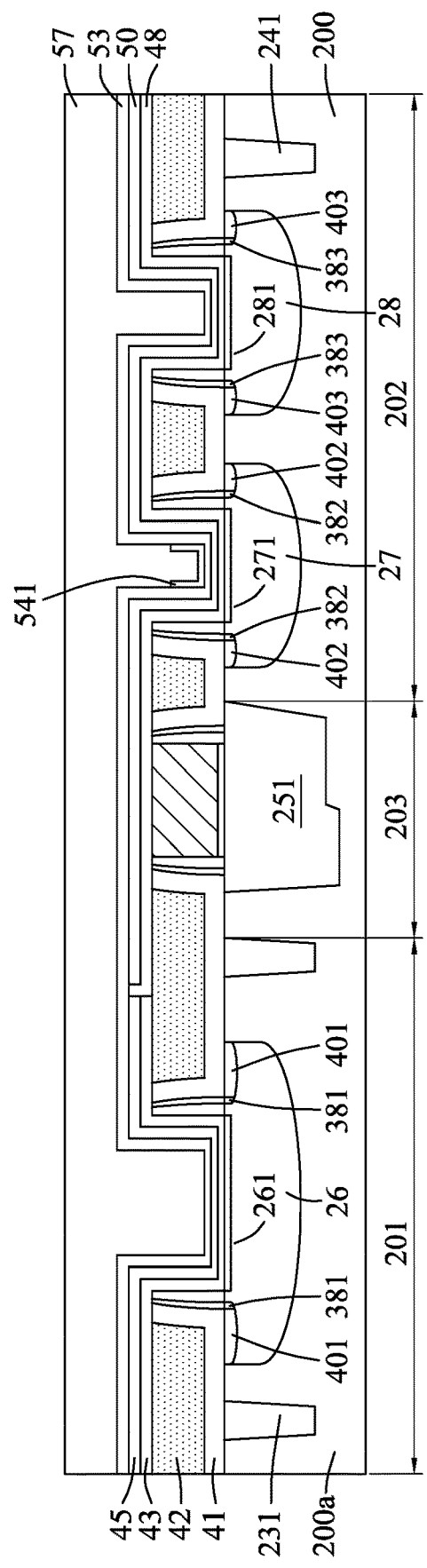

Referring to FIGS. 1D and 38, the method 100 proceeds to step 137, where a metal fill layer 57 is formed over the structure of FIG. 37 to fill the first and second recesses 33a, 35a, 36a (see FIG. 18) located respectively above the memory well 26, the first logic well 27, and the second logic well 28. The metal fill layer 57 may include, but not limited to, tungsten, platinum, aluminum copper, gold, titanium, tantalum, tantalum nitride, tungsten nitride, tantalum aluminum carbide, other suitable materials, alloys thereof, or combinations thereof. The metal fill layer 57 may be formed using, for example, CVD, PVD, electroless plating or other suitable techniques. In some embodiments, the metal fill layer 57 is an N metal layer.

Figure 39:
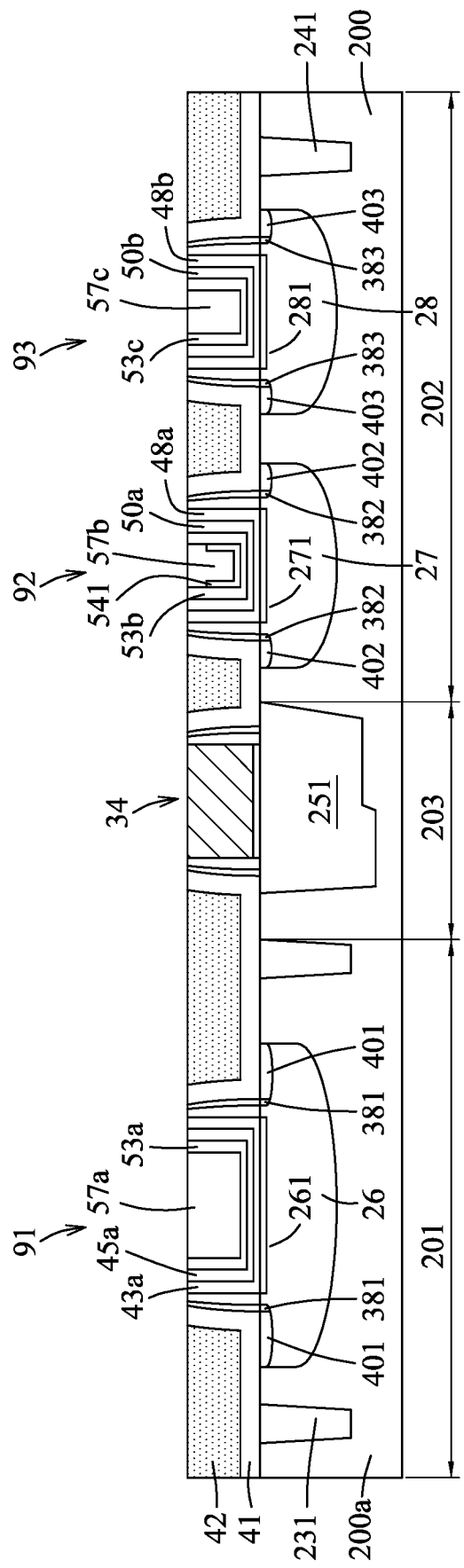

Referring to FIGS. 1D and 39, the method 100 proceeds to step 138, where the metal fill layer 57 is planarized to a point that an uppermost surface of the planarized first dielectric layer 42 is exposed, thereby forming a memory device (e.g., a FeDRAM device) 91, a first logic device 92 and a second logic device 93. The dummy wall 34 is located between the memory device 91 and the first logic device 92. The memory device 91 is at the memory substrate region 201, and the first and second logic devices 92, 93 are at the logic substrate region 202. The metal fill layer 57 may be planarized using, for example, CMP, or other suitable techniques. After step 138, an excess of the metal fill layer 57 is removed to form (i) a memory gate 57a in the first recess 33a (see FIG. 18) above the memory channel region 261 in the memory device 91, (ii) a first logic gate 57b in the second recess 35a (see FIG. 18) above the first channel region 271 in the first logic device 92, and (iii) a second logic gate 57c in the second recess 36a (see FIG. 18) above the second channel region 281 in the second logic device 93. In addition, after step 138, an excess of the first ferroelectric portion of the ferroelectric layer 43 shown in FIG. 38 is removed such that a region of the first ferroelectric portion is left on the surface of the first recess 33a to form a data storage element 43a of the memory device 91. The data storage element 43a includes a ferroelectric material, and is disposed around the memory gate 57a to separate the memory gate 57a from the memory channel region 261. In some embodiments, the data storage element 43a may have a thickness ranging from about 50 Å to about 150 Å. In some embodiments, the data storage element 43a may have a U-shape cross section. An excess portion of the gate dielectric layer 48 shown in FIG. 38 is removed such that two portions of the gate dielectric layer 48 are respectively left on the surfaces of the second recesses 35a, 36a to form a first gate dielectric 48a in the first logic device 92 and a second gate dielectric 48b in the second logic device 93. The first gate dielectric 48a is disposed around the first logic gate 57b to separate the first logic gate 57b from the first logic channel region 271. The second gate dielectric 48b is disposed around the second logic gate 57c to separate the second logic gate 57c from the second logic channel region 281. In some embodiments, each of the first gate dielectric 48a and the second gate dielectric 48b may include tantalum oxide ($Ta_2O_5$), titanium oxide ($TiO_2$), hafnium oxide ($HfO_2$), aluminum oxide ($Al_2O_3$), zirconium oxide ($ZrO_2$), hafnium silicate ($HfSiO_x$), zirconium silicate ($ZrSiO_4$), lanthanum oxide ($La_2O_3$), praseodymium oxide ($Pr_2O_3$), or combinations thereof. In some embodiments, each of the first gate dielectric 48a and the second gate dielectric 48b may have a thickness ranging from 5 Å to 30 Å. The first barrier layer 45 shown in FIG. 38 is formed into a barrier portion 45a. The second barrier layer 50 shown in FIG. 38 is formed into two barrier portions 50a, 50b respectively in the first and the second logic devices 92, 93. The etch stop layer 53 shown in FIG. 38 is formed into a first etch stop portion 53a in the memory device 91, a second etch stop portion 53b in the first logic device 92, and a third etch stop portion 53c in the second logic device 93. In some embodiments, a memory gate structure of the memory device 91 may include the memory gate 57a, the data storage element 43a, the first interfacial layer 44, the barrier portion 45a, and the first etch stop portion 53a. A first gate structure of the first logic device 92 may include the first logic gate 57b, the first gate dielectric 48a, the second interfacial layer 49 on the first logic well 27, the barrier portion 50a, the second etch stop portion 53b, and the P metal portion 541. A second gate structure of the second logic device 93 may include the second logic gate 57c, the second gate dielectric 48b, the second interfacial layer 49 on the second logic well 28, the barrier portion 50b, and the third etch stop portion 53c. In some embodiments, the memory gate structure and the first and second gate structures may have substantially the same height. In some embodiments, the memory device 91 is an N-FeDRAM device, the first logic device 92 is a PFET device, and the second logic device 93 is an NFET device. In some embodiments, the first logic device 92 is a p-type transistor, and the P metal portion 541 is disposed between the first gate dielectric 48a and the first logic gate 57b.

Figure 40:
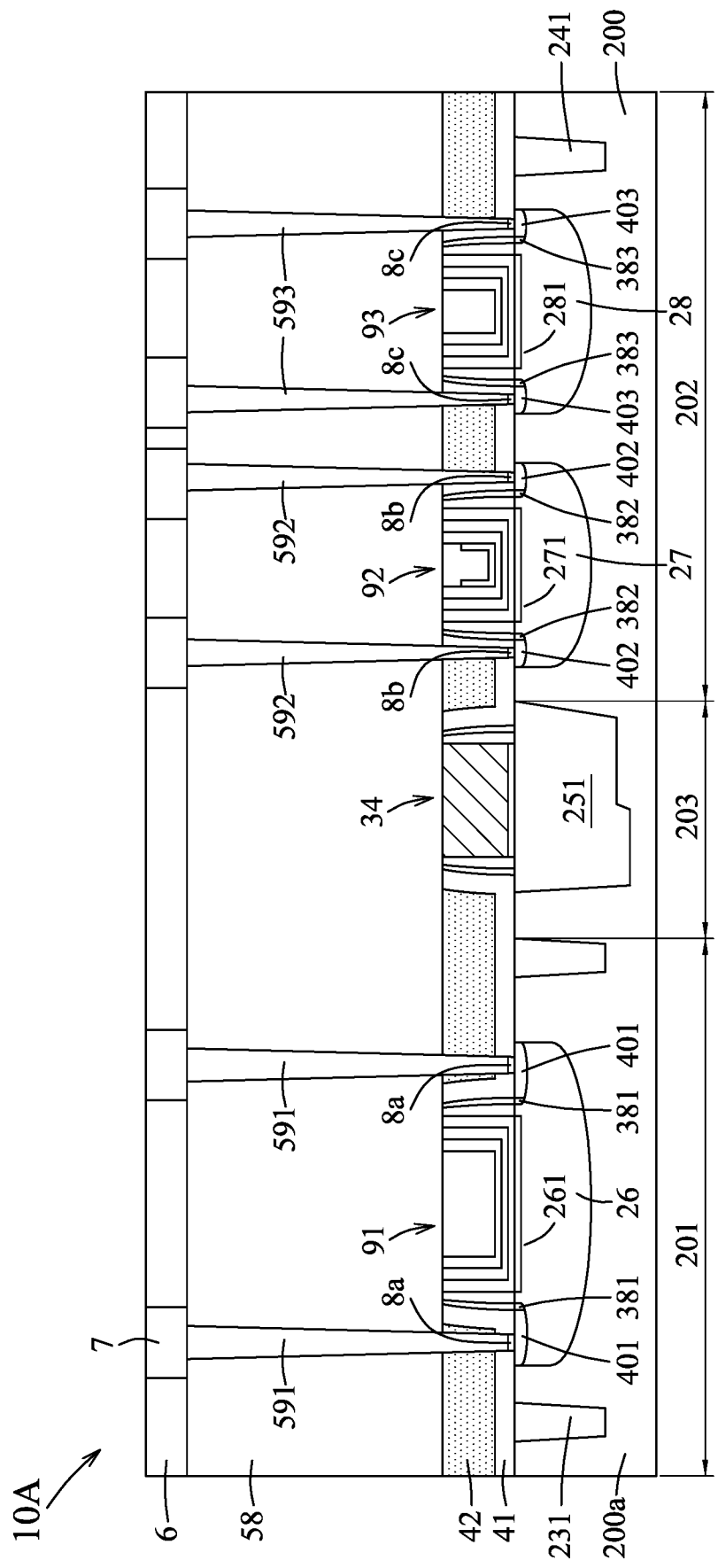

Referring to FIGS. 1D and 40, the method 100 proceeds to step 139, where an interconnect feature is formed on the structure shown in FIG. 39. The interconnect feature includes a second dielectric layer 58, three pairs of source/drain contacts 591, 592, 593, a third dielectric layer 6, and metal lines 7. The second dielectric layer 58 is formed on the structure shown in FIG. 39. The materials and deposition for the second dielectric layer 58 may be similar to those for the planarized first dielectric layer 42, and the details thereof are hence omitted for the sake of brevity. After the formation of the second dielectric layer 58, the three pairs of the source/drain contacts 591, 592, 593 are formed to extend through the second dielectric layer 58, the planarized first dielectric layer 42, and the planarized CESL 41 to be in electrical contact with the three pairs of the source/drain regions 401, 402, 403, respectively. The formation of the pairs of the source/drain contacts 591, 592, 593 may be implemented by (i) forming a patterned mask (not shown), (ii) etching the second dielectric layer 58, the planarized first dielectric layer 42, and the planarized CESL 41 to form three pairs of trenches (not shown) that expose the three pairs of the source/drain regions 401, 402, 403, respectively, (iii) depositing a contact material on the second dielectric layer 58 to fill the trenches, and (iv) removing the excess contact material on the second dielectric layer 58. In some embodiments, the deposition of the contact material may be implemented using, for example, CVD, PVD, electroless plating, electroplating, or other suitable deposition techniques. In some embodiments, the source/drain contacts 591, 592, 593 may include, but not limited to, copper, aluminum, tungsten, or combinations thereof. Other suitable materials for the source/drain contacts 591, 592, 593 are within the contemplated scope of the present disclosure. In some embodiments, the removal of the excess contact material may be implemented using, for example, CMP, or other suitable planarization techniques. In some embodiments, before the deposition of the pairs of the source/drain contacts 591, 592, 593, three pairs of silicide pads 8a, 8b, 8c may be formed on the three pairs of the source/drain regions 401, 402, 403, respectively. After the formation of the source/drain contacts 591, 592, 593, the third dielectric layer 6 is formed on the second dielectric layer 58 and the source/drain contacts 591, 592, 593. In some embodiments, the material and formation for the third dielectric layer 6 may be similar to those for the planarized first dielectric layer 42, and the details thereof are hence omitted for the sake of brevity. After the formation of the third dielectric layer 6, the metal lines 7 are formed in the third dielectric layer 6 such that the metal lines 7 are respectively in electrical contact with the source/drain contacts 591, 592, 593. The formation for the metal lines 7 may be implemented by (i) patterning the third dielectric layer 6 to form recesses (not shown) to expose the source/drain contacts 591, 592, 593, (ii) depositing a metallic material on the third dielectric layer 6 to fill the recesses, and (iii) removing the excess metallic material on the third dielectric layer 6. In some embodiments, the third dielectric layer 6 is patterned using known photolithography and etching processes. In some embodiments, the deposition of the metallic material for the metal lines 7 may be implemented using, for example, CVD, PVD, electroless plating, electroplating, or other suitable deposition techniques. In some embodiments, the metal lines 7 may include, but not limited to, copper, aluminum, tungsten, or combinations thereof. Other suitable materials for the metal lines 7 are within the contemplated scope of the present disclosure. In some embodiments, the removal of the excess metallic material may be implemented using, for example, CMP, or other suitable planarization techniques. After step 139, an integrated circuit (IC) 10A is obtained. In alternative embodiments, other suitable methods may also be applied for forming the IC 10A. In yet alternative embodiments, additional features may be added in the IC 10A, and some features in the IC 10A may be modified, replaced, or eliminated without departure of the spirit and scope of the present disclosure.

Figure 41:
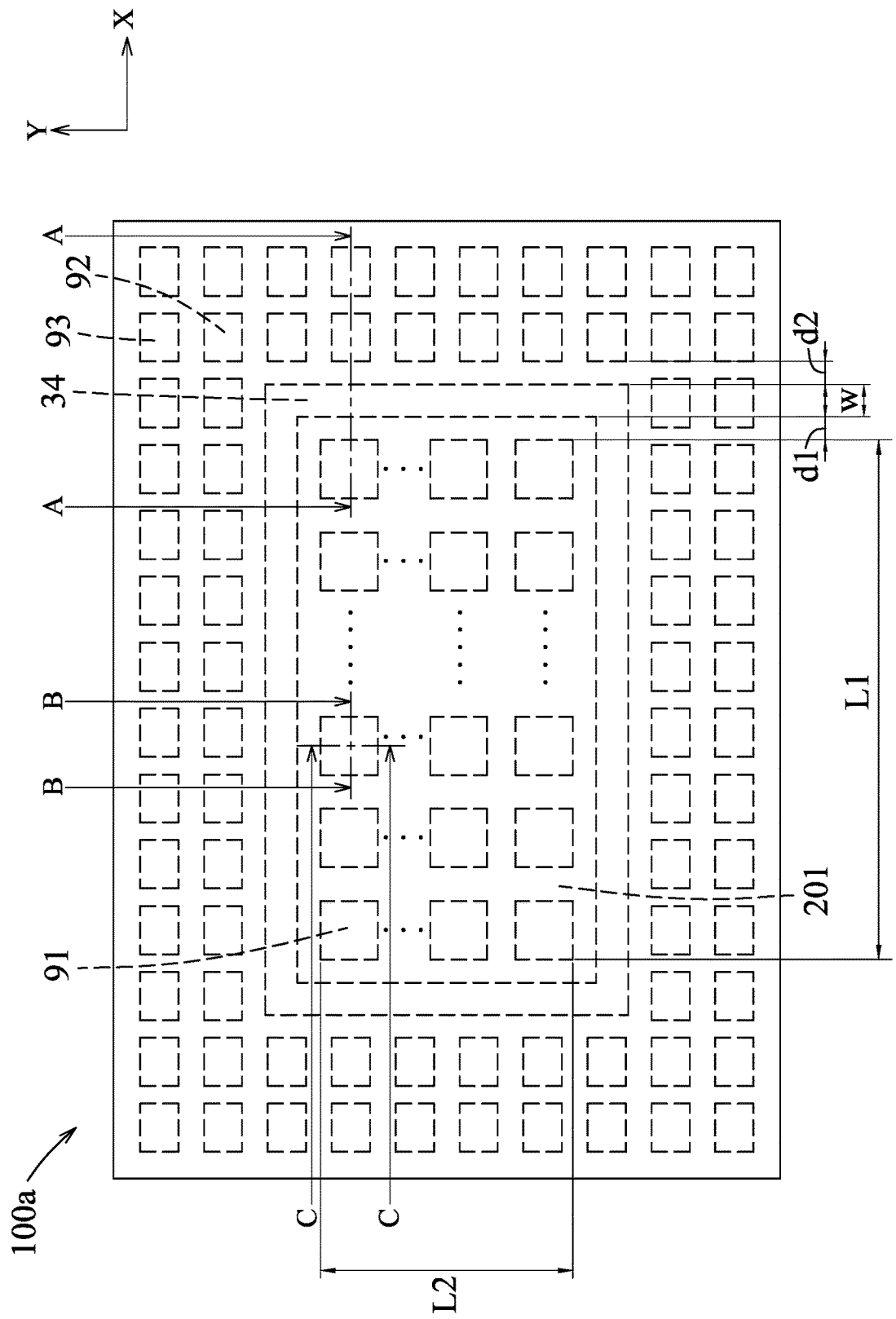
FIG. 41 illustrates a schematic top view of an integrated circuit in accordance with some embodiments.
Figure 42:
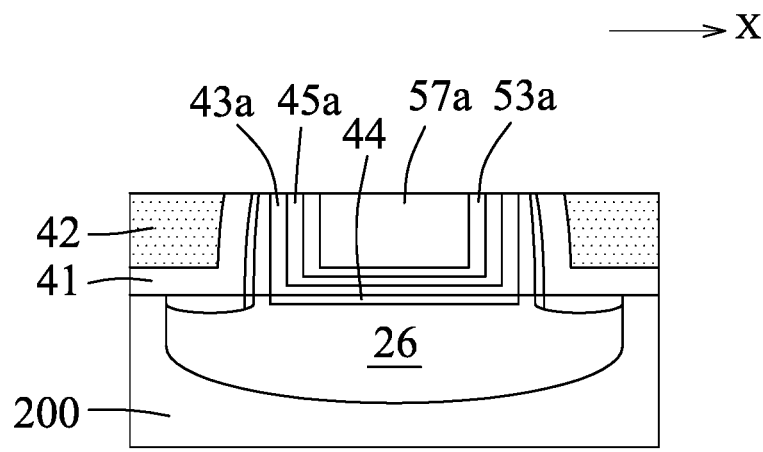
FIGS. 42 and 43 are schematic cross-sectional views taken along line B-B in an X direction and line C-C in a Y direction of FIG. 41, respectively.
Figure 43:
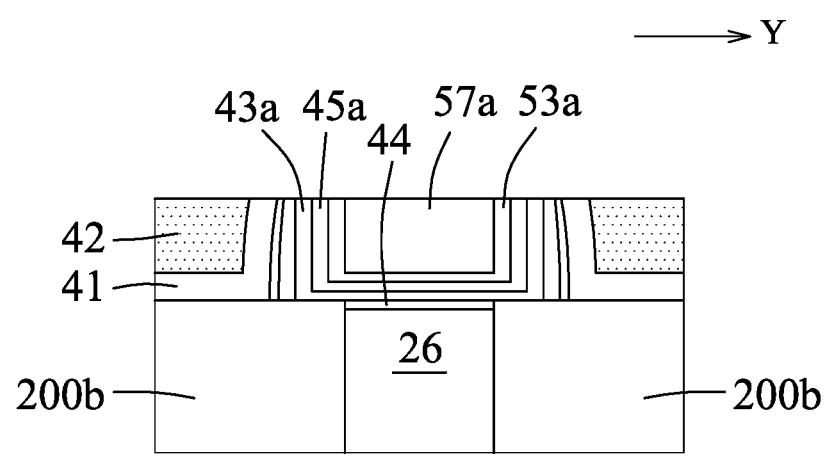

Referring to FIG. 41, in accordance with some embodiments, an IC 100a includes the memory devices (e.g., FeDRAM devices) 91, the dummy wall 34, the first logic devices 92, and the second logic devices 93. The memory devices 91 are located within the memory substrate region 201, and are surrounded by the dummy wall 34. In some embodiments, FIG. 40 showing the IC 10A may be a cross-sectional view taken along line A-A of FIG. 41. FIG. 42 is a fragmentary cross-sectional view taken along line B-B in an X direction. FIG. 43 is a fragmentary cross-sectional view taken along line C-C in a Y direction transverse to the X direction. Two adjacent ones of the memory devices 91 in the Y direction may be separated from each other through a STI structure 200b (see FIGS. 41 and 43). The memory substrate region 201 may have a length (L1) in the X direction and a length (L2) in the Y direction. A distance between the memory substrate region 201 and the dummy wall 34 is represented as "d1," and a distance between the dummy wall 34 and each of the first logic devices 92 is represented as "d2." Each of the distances (d1, d2) may range from about 0.2 μm to about 0.5 μm. Each of the lengths (L1, L2) may range from about 50 μm to about 200 μm. A width (W) of the dummy wall 34 may vary with the variation of the distances (d1, d2). For example, if the distance (d1, d2) is a respective one of about 0.2 μm, about 0.3 μm, about 0.4 μm, and about 0.5 μm, the width (W) of the dummy wall 34 may be in a corresponding one of a range from about 0.6 μm to about 1.1 μm, a range from about 0.7 μm to about 1.2 μm, a range from about 0.8 μm to about 1.3 μm, and a range from about 0.8 μm to about 1.4 μm(namely, the larger the distance (d1, d2), the larger the lower and upper limits of the range of the width (W) of the dummy wall 34). A number of the dummy wall 34 may vary with the variation of the lengths (L1, L2) of the memory substrate region 201. For example, if the length (L1, L2) is a respective one of about 50 μm, about 100 μm, about 150 μm, and about 200 μm, the number of the dummy wall 34 may be a corresponding one of 1, 2, 3, and 4, respectively (namely, the larger the length (L1, L2), the larger the number of the dummy wall 34).

In this disclosure, an IC is made by a HK last method, and includes and integrates a memory device, a dummy wall, and first and second logic devices. Compared with an IC made by the HK first method, the data storage element of the memory device and the gate dielectrics of the first and second logic devices of this disclosure are not adversely affected during etching, and an undesirable residue (e.g., high-k material residue) is not found within the IC. In some embodiments, the number of the dummy wall, which is at least one, may vary depending on the layout design of the IC, thereby effectively preventing dishing during planarization process (e.g., CMP).

In accordance with some embodiments of the present disclosure, a semiconductor device includes a semiconductor substrate, a memory gate, and a data storage element. The semiconductor substrate includes a memory well which has two memory source/drain regions and a memory channel region between the memory source/drain regions. The memory gate is disposed above the memory channel region. The data storage element includes a ferroelectric material, and is disposed around the memory gate to separate the memory gate from the memory channel region.

In accordance with some embodiments of the present disclosure, the ferroelectric material includes hafnium oxide, hafnium silicate, hafnium zirconate, barium titanate, lead titanate, strontium titanate, calcium manganite, bismuth ferrite, aluminum scandium nitride, aluminum gallium nitride, aluminum yttrium nitride, doped hafnium oxide, lead zirconate titanate, barium strontium titanate, strontium bismuth tantalate, or combinations thereof.

In accordance with some embodiments of the present disclosure, the data storage element has a thickness ranging from 50 Å to 150 Å.

In accordance with some embodiments of the present disclosure, the memory well further includes two lightly doped regions, each of which is disposed between the memory channel region and a corresponding one of the source/drain regions.

In accordance with some embodiments of the present disclosure, the data storage element has a U-shape cross section.

In accordance with some embodiments of the present disclosure, an integrated circuit includes a semiconductor substrate, a memory device, a logic device, and a dummy wall. The semiconductor substrate includes a memory substrate region, a logic substrate region, and a boundary substrate region between the memory substrate region and the logic substrate region. The memory device includes a memory well and a memory gate structure. The memory well is formed in the memory substrate region, and has two memory source/drain regions and a memory channel region between the memory source/drain regions. The memory gate structure includes a memory gate disposed above the memory channel region, and a data storage element including a ferroelectric material. The data storage element is disposed around the memory gate to separate the memory gate from the memory channel region. The logic device includes a logic well and a gate structure. The logic well is formed in the logic substrate region, and has two logic source/drain regions and a logic channel region between the logic source/drain regions. The gate structure includes a logic gate and a gate dielectric. The logic gate is disposed above the logic channel region. The gate dielectric is disposed around the logic gate to separate the logic gate from the logic channel region. The dummy wall is disposed on the boundary substrate region.

In accordance with some embodiments of the present disclosure, the memory gate structure and the gate structure have the same height.

In accordance with some embodiments of the present disclosure, the ferroelectric material includes hafnium oxide, hafnium silicate, hafnium zirconate, barium titanate, lead titanate, strontium titanate, calcium manganite, bismuth ferrite, aluminum scandium nitride, aluminum gallium nitride, aluminum yttrium nitride, doped hafnium oxide, lead zirconate titanate, barium strontium titanate, strontium bismuth tantalate, or combinations thereof.

In accordance with some embodiments of the present disclosure, the data storage element has a thickness ranging from 50 Å to 150 Å.

In accordance with some embodiments of the present disclosure, the gate dielectric includes tantalum oxide, titanium oxide, hafnium oxide, aluminum oxide, zirconium oxide, hafnium silicate, zirconium silicate, lanthanum oxide, praseodymium oxide, or combinations thereof.

In accordance with some embodiments of the present disclosure, the gate dielectric has a thickness ranging from 5 Å to 30 Å.

In accordance with some embodiments of the present disclosure, the logic device is a p-type transistor, and the gate structure further includes a P metal portion disposed between the gate dielectric and the logic gate.

In accordance with some embodiments of the present disclosure, a method for manufacturing an integrated circuit includes: forming a boundary isolation in a semiconductor substrate; forming a memory well and a logic well in the semiconductor substrate, the memory well and the logic well being located at two opposite sides of the boundary isolation, the memory well having two memory source/drain regions and a memory channel region between the memory source/drain regions, the logic well having two logic source/drain regions and a logic channel region between the logic source/drain regions; forming a patterned dielectric structure on the semiconductor substrate, the patterned dielectric feature having a first recess which exposes the memory channel region, and a second recess which exposes the logic channel region; forming a data storage element along a surface of the first recess; forming a gate dielectric along a surface of the second recess; forming a memory gate in the first recess such that the data storage element is disposed around the memory gate; and forming a logic gate in the second recess such that the gate dielectric is disposed around the logic gate.

In accordance with some embodiments of the present disclosure, the semiconductor substrate includes a memory substrate region, a logic substrate region, and a boundary substrate region between the memory substrate region and the logic substrate region. The boundary isolation is formed in the boundary substrate region, and the memory well and the logic well are formed in the memory substrate region and the logic substrate region, respectively.

In accordance with some embodiments of the present disclosure, the formation of the data storage element includes: conformally depositing a ferroelectric layer over the patterned dielectric structure along the surface of the first recess and along the surface of the second recess; partially removing the ferroelectric layer such that a first ferroelectric portion of the ferroelectric layer is left on the memory substrate region; and removing an excess of the first ferroelectric portion such that a region of the first ferroelectric portion is left on the surface of the first recess to serve as the data storage element.

In accordance with some embodiments of the present disclosure, the formation of the gate dielectric includes: conformally depositing a gate dielectric layer over the patterned dielectric structure, on the first ferroelectric portion, and along the surface of the second recess; and removing an excess of the gate dielectric layer such that a portion of the gate dielectric layer is left on the surface of the second recess to serve as the gate dielectric.

In accordance with some embodiments of the present disclosure, the memory gate and the logic gate are formed simultaneously.

In accordance with some embodiments of the present disclosure, the formation of the memory gate and the logic gate includes: depositing a metal fill layer on the gate dielectric layer to fill the first and second recesses; and removing an excess of the metal fill layer such that the metal fill layer is formed into the memory gate in the first recess and the logic gate in the second recess.

In accordance with some embodiments of the present disclosure, removing the excess of the gate dielectric layer, removing the excess of the first ferroelectric portion, and removing the excess of the metal fill layer are implemented simultaneously.

In accordance with some embodiments of the present disclosure, a P metal portion is further formed between the gate dielectric and the logic gate.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing an integrated circuit, comprising:

forming a boundary isolation in a semiconductor substrate;

forming a memory well and a logic well in the semiconductor substrate, the memory well and the logic well being located at two opposite sides of the boundary isolation, the memory well having two memory source/drain regions and a memory channel region between the two memory source/drain regions, the logic well having two logic source/drain regions and a logic channel region between the two logic source/drain regions;

forming a dummy wall on the boundary isolation, the dummy wall including a dummy gate portion and a dummy dielectric portion, and having a rectangular cross section;

forming a patterned dielectric structure on the semiconductor substrate to expose the dummy wall, the patterned dielectric structure having a first recess which exposes the memory channel region, and a second recess which exposes the logic channel region;

forming a data storage element along a surface of the first recess;

forming a gate dielectric along a surface of the second recess;

forming a memory gate in the first recess such that the data storage element is disposed around the memory gate; and forming a logic gate in the second recess such that the gate dielectric is disposed around the logic gate, wherein the semiconductor substrate includes a memory substrate region, a logic substrate region, and a boundary substrate region between the memory substrate region and the logic substrate region, the boundary isolation being formed in the boundary substrate region, the memory well and the logic well being formed in the memory substrate region and the logic substrate region, respectively;

wherein the formation of the data storage element includes:
  conformally depositing a ferroelectric layer over the patterned dielectric structure along the surface of the first recess and along the surface of the second recess,
  partially removing the ferroelectric layer such that a first ferroelectric portion of the ferroelectric layer is left on the memory substrate region, and
  removing an excess of the first ferroelectric portion such that a region of the first ferroelectric portion is left on the surface of the first recess to serve as the data storage element and wherein the formation of the gate dielectric includes:
  conformally depositing a gate dielectric layer over the patterned dielectric structure, on the first ferroelectric portion, and along the surface of the second recess, and
  removing an excess of the gate dielectric layer such that a portion of the gate dielectric layer is left on the surface of the second recess to serve as the gate dielectric.

2. The method of claim 1, wherein the memory gate and the logic gate are formed simultaneously.

3. The method of claim 2, wherein the formation of the memory gate and the logic gate includes:
depositing a metal fill layer on the gate dielectric layer to fill the first recess and the second recess and removing an excess of the metal fill layer such that the metal fill layer is formed into the memory gate in the first recess and the logic gate in the second recess.

4. The method of claim 3, wherein removing the excess of the gate dielectric layer, removing the excess of the first ferroelectric portion, and removing the excess of the metal fill layer are implemented simultaneously.

5. The method of claim 1, further comprising forming a P metal portion between the gate dielectric and the logic gate.

6. A method for manufacturing an integrated circuit, comprising:
forming a boundary isolation in a semiconductor substrate;
forming a memory well and a logic well in the semiconductor substrate, the memory well and the logic well being located at two opposite sides of the boundary isolation;
forming two memory source/drain regions in the memory well so as to obtain a memory channel region between the two memory source/drain regions;
forming two logic source/drain regions in the logic well so as to obtain a logic channel region between the two logic source/drain regions;
forming a patterned dielectric structure on the semiconductor substrate, the patterned dielectric structure having a first recess which exposes the memory channel region, and a second recess which exposes the logic channel region;
forming a ferroelectric layer over the patterned dielectric structure such that the ferroelectric layer is formed along inner surfaces of the first recess and inner surfaces of the second recess;
removing a portion of the ferroelectric layer on the inner surfaces of the second recess;
forming a gate dielectric layer over the patterned dielectric structure such that the gate dielectric layer is formed on a remaining portion of the ferroelectric layer and is formed along the inner surfaces of the second recess;
removing a portion of the gate dielectric layer on the remaining portion of the ferroelectric layer;
forming a p metal layer over the patterned dielectric structure such that the p metal layer is formed to cover the remaining portion of the ferroelectric layer and a remaining portion of the gate dielectric layer;
patterning the p metal layer into a p metal portion which is disposed on the remaining portion of the gate dielectric layer in the second recess;
forming a metal filling layer to fill the first recess and the second recess to cover the remaining portion of the ferroelectric layer, the remaining portion of the gate dielectric layer, and the p metal portion; and
performing a planarization process to planarize the remaining portion of the ferroelectric layer, the remaining portion of the gate dielectric layer, and the metal filling layer, such that the remaining portion of the ferroelectric layer is formed into a data storage element on the inner surfaces of the first recess, the remaining portion of the gate dielectric layer is formed into a gate dielectric on the inner surfaces of the second recess, and the metal filling layer is formed into a first metal portion and a second metal portion which are respectively in the first recess and the second recess.

7. The method of claim 6, wherein the patterned dielectric structure is formed by:
forming a dummy memory structure on the memory well before formation of the two memory source/drain regions such that the memory channel region is disposed beneath the dummy memory structure;
forming two memory gate spacers at two opposite sides of the dummy memory structure;
forming a dummy logic structure on the logic well before formation of the two logic source/drain regions such that the logic channel region is disposed beneath the dummy logic structure;
forming two logic gate spacers at two opposite sides of the dummy logic structure;
removing the dummy memory structure after formation of the two memory source/drain regions so as to form the first recess located between the two memory gate spacers and on the memory channel region; and
removing the dummy logic structure after formation of the two logic source/drain regions so as to form the second recess located between the two logic gate spacers and on the logic channel region.

8. The method of claim 7, wherein:
formation of the two memory gate spacers includes forming two first sidewall spacers at the two opposite sides of the dummy memory structure, and forming two second sidewall spacers respectively on the two first sidewall spacers; and
after formation of the two memory gate spacers, the two memory source/drain regions are formed in two opposite regions of the memory well which are exposed from the two memory gate spacers and the dummy memory structure.

9. The method of claim 8, further comprising:
before formation of the two second sidewall spacers, forming two lightly doped regions in the two opposite regions of the memory well which are exposed from the two first sidewall spacers and the dummy memory structure such that after formation of the two memory source/drain regions, each of the two memory source/drain regions partially overlaps a corresponding one of the two lightly doped regions, the two lightly doped regions having a doping concentration lower than that of the two memory source/drain regions.

10. The method of claim 6, wherein the ferroelectric layer has a thickness ranging from 50 Å to 150 Å.

11. The method of claim 6, wherein the gate dielectric layer has a thickness ranging from 5 Å to 30 Å.

12. The method of claim 6, wherein the ferroelectric layer includes hafnium oxide, hafnium silicate, hafnium zirconate, barium titanate, lead titanate, strontium titanate, calcium manganite, bismuth ferrite, aluminum scandium nitride, aluminum gallium nitride, aluminum yttrium nitride, doped hafnium oxide, lead zirconate titanate, barium strontium titanate, strontium bismuth tantalate, or combinations thereof.

13. The method of claim 6, wherein each of the data storage element and the gate dielectric has a U-shape cross section.

14. A method for manufacturing an integrated circuit, comprising:
forming a boundary isolation in a semiconductor substrate;
forming a memory well and a logic well in the semiconductor substrate, the memory well and the logic well being located at two opposite sides of the boundary isolation, the memory well having two memory source/drain regions and a memory channel region between the two memory source/drain regions, the logic well having two logic source/drain regions and a logic channel region between the two logic source/drain regions;

forming a dummy wall on the boundary isolation, the dummy wall including a dummy gate portion and a dummy dielectric portion, and having a rectangular cross section;

forming a patterned dielectric structure on the semiconductor substrate to expose the dummy wall, the patterned dielectric structure having a first recess which exposes the memory channel region, and a second recess which exposes the logic channel region;

forming a data storage element along a surface of the first recess;

forming a gate dielectric along a surface of the second recess;

forming a memory gate in the first recess such that the data storage element is disposed around the memory gate; and forming a logic gate in the second recess such that the gate dielectric is disposed around the logic gate, wherein the semiconductor substrate includes a memory substrate region, a logic substrate region, and a boundary substrate region between the memory substrate region and the logic substrate region, the boundary isolation being formed in the boundary substrate region, the memory well and the logic well being formed in the memory substrate region and the logic substrate region, respectively;

wherein the formation of the data storage element includes:

conformally depositing a ferroelectric layer over the patterned dielectric structure along the surface of the first recess and along the surface of the second recess, partially removing the ferroelectric layer such that a first ferroelectric portion of the ferroelectric layer is left on the memory substrate region, and removing an excess of the first ferroelectric portion such that a region of the first ferroelectric portion is left on the surface of the first recess to serve as the data storage element;

wherein the formation of the gate dielectric includes:

conformally depositing a gate dielectric layer over the patterned dielectric structure, on the first ferroelectric portion, and along the surface of the second recess, and removing an excess of the gate dielectric layer such that a portion of the gate dielectric layer is left on the surface of the second recess to serve as the gate dielectric; and wherein the ferroelectric layer has a thickness ranging from 50 Å to 150 Å.

15. The method of claim 14, wherein the gate dielectric layer has a thickness ranging from 5 Å to 30 Å.

16. The method of claim 14, wherein the memory gate and the logic gate are formed simultaneously.

17. The method of claim 16, wherein the formation of the memory gate and the logic gate includes:

depositing a metal fill layer on the gate dielectric layer to fill the first recess and the second recess and removing an excess of the metal fill layer such that the metal fill layer is formed into the memory gate in the first recess and the logic gate in the second recess.

18. The method of claim 17, wherein removing the excess of the gate dielectric layer, removing the excess of the first ferroelectric portion, and removing the excess of the metal fill layer are implemented simultaneously.

19. The method of claim 14, further comprising forming a P metal portion between the gate dielectric and the logic gate.

20. The method of claim 14, wherein each of the data storage element and the gate dielectric has a U-shape cross section.

* * * * *